US012613475B2

(12) United States Patent
Chu et al.

(10) Patent No.: US 12,613,475 B2
(45) Date of Patent: Apr. 28, 2026

(54) LEVELING SYSTEM FOR CANTILEVER CALIBRATION

(71) Applicant: Taiwan Semiconductor Manufacturing Company, LTD., Hsinchu (TW)

(72) Inventors: Chao-Hung Chu, Keelung (TW); Ching-Hui Lin, Taichung (TW); Fu-Chun Huang, Zhubei (TW); Po-Chen Yeh, New Taipei (TW); Yi-Hsien Chang, Shetou (TW); Chun-Ren Cheng, Hsinchu (TW); Shih-Fen Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 226 days.

(21) Appl. No.: 18/581,513

(22) Filed: Feb. 20, 2024

(65) Prior Publication Data

US 2025/0264816 A1    Aug. 21, 2025

(51) Int. Cl.
G03F 9/00 (2006.01)

(52) U.S. Cl.
CPC ................................. G03F 9/7034 (2013.01)

(58) Field of Classification Search
CPC ....... G03F 9/7034; H01L 28/91; H01L 28/92; H01L 21/768; H01G 4/30; H01G 4/005; H01G 4/228
See application file for complete search history.

(56) References Cited

U.S. PATENT DOCUMENTS

2020/0098518 A1*    3/2020   Lee ..................... H01L 23/5223

FOREIGN PATENT DOCUMENTS

| CN | 101573861 A | 11/2009 |
| CN | 110602616 A | 12/2019 |
| TW | 202110734 A | 3/2021 |

OTHER PUBLICATIONS

Taiwan Office Action of Application No. 11420760960, Dated Jul. 22, 2025.

* cited by examiner

*Primary Examiner* — Don J Williams
(74) *Attorney, Agent, or Firm* — Lippes Mathias LLP

(57) ABSTRACT

In a micro-electromechanical system (MEMS) structure, leveling of a cantilever is performed using a dual-capacitor leveling system. One capacitor is used to determine the amount or degree of deformation. The other capacitor is used in conjunction with a diode to determine the direction of the deformation. This information can be used to calibrate the position of the cantilever for consistent positioning during operation. Methods for forming the dual-capacitor leveling system are also disclosed.

20 Claims, 37 Drawing Sheets

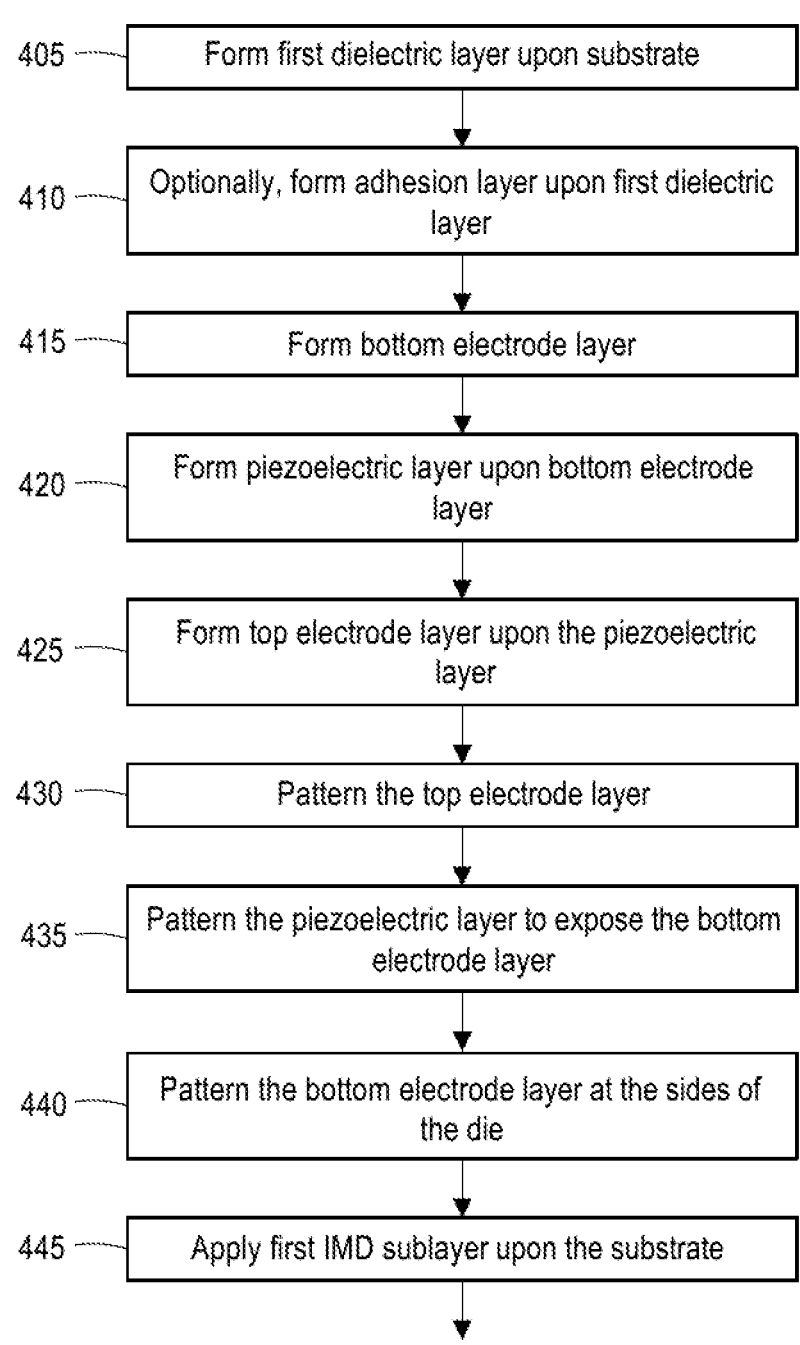

400

405 —— Form first dielectric layer upon substrate

410 —— Optionally, form adhesion layer upon first dielectric layer

415 —— Form bottom electrode layer

420 —— Form piezoelectric layer upon bottom electrode layer

425 —— Form top electrode layer upon the piezoelectric layer

430 —— Pattern the top electrode layer

435 —— Pattern the piezoelectric layer to expose the bottom electrode layer

440 —— Pattern the bottom electrode layer at the sides of the die

445 —— Apply first IMD sublayer upon the substrate

FIG. 3A 400 cont.

450 — Pattern the first IMD sublayer to expose the bottom electrode layer in the first capacitor region 455 — Apply first insulator film upon the substrate 460 — Pattern the first insulator film to be present only in the first capacitor region 465 — Apply second IMD sublayer upon the substrate, form IMD layer 400 cont.

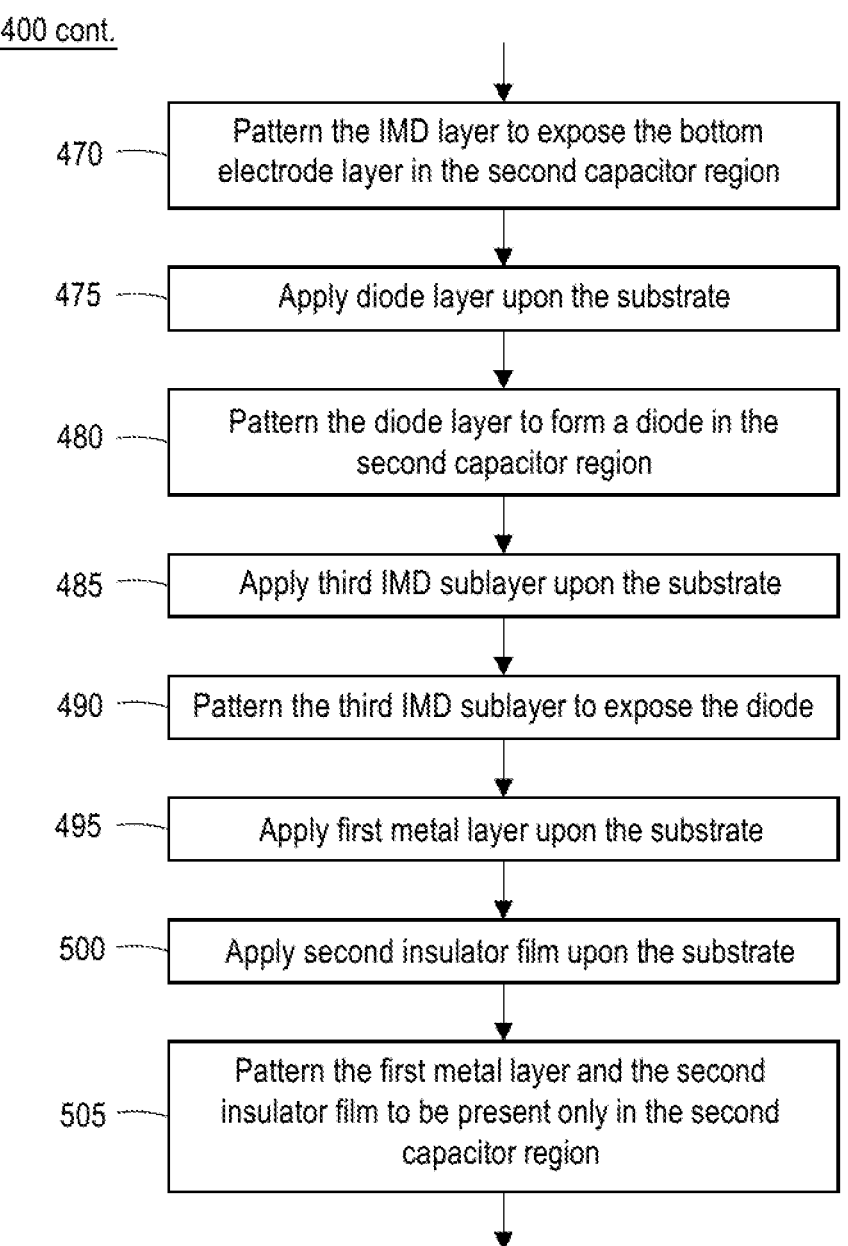

470 — Pattern the IMD layer to expose the bottom electrode layer in the second capacitor region 475 — Apply diode layer upon the substrate 480 — Pattern the diode layer to form a diode in the second capacitor region 485 — Apply third IMD sublayer upon the substrate 490 — Pattern the third IMD sublayer to expose the diode 495 — Apply first metal layer upon the substrate 500 — Apply second insulator film upon the substrate 505 — Pattern the first metal layer and the second insulator film to be present only in the second capacitor region

FIG. 3C 400 cont.

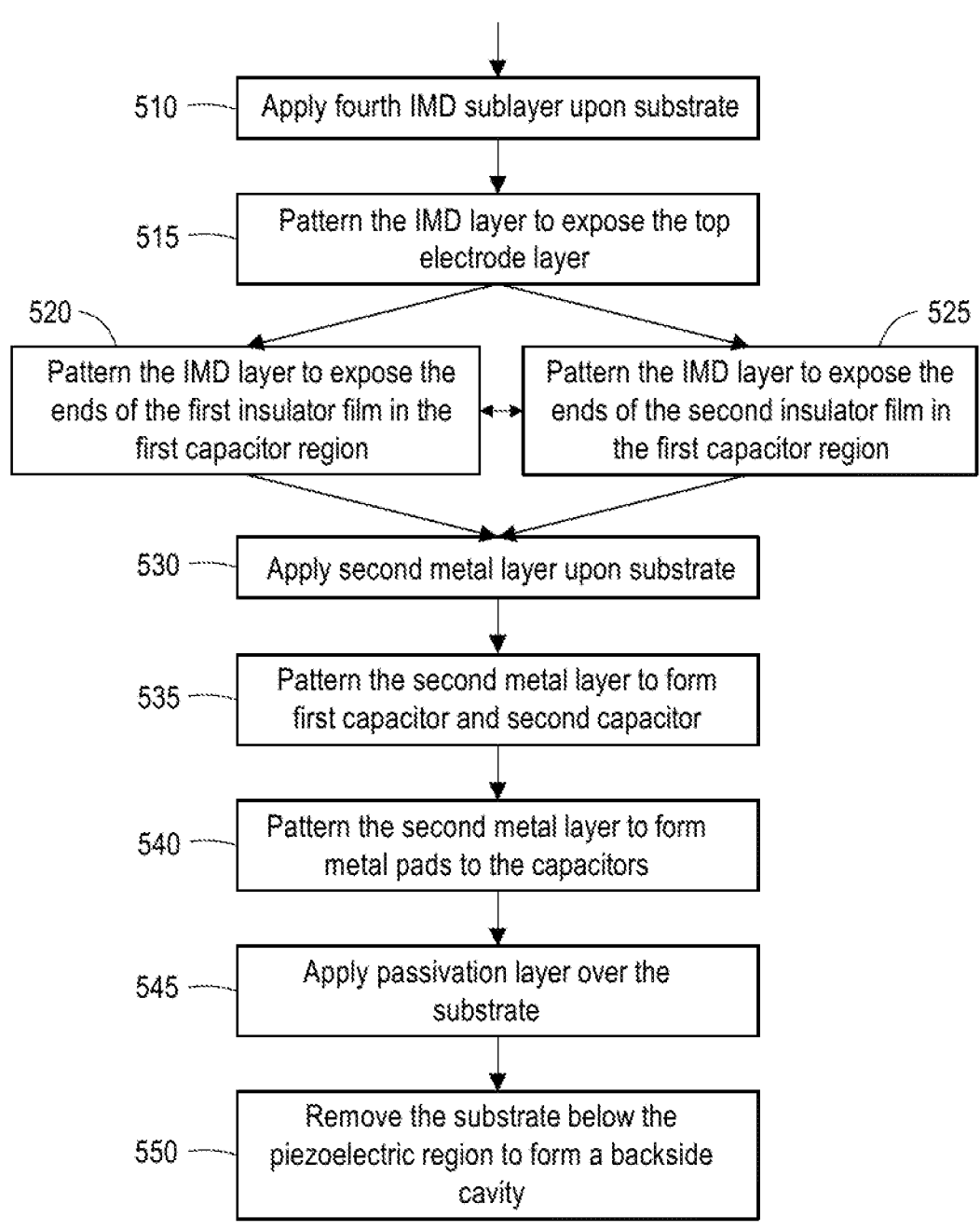

510 — Apply fourth IMD sublayer upon substrate

515 — Pattern the IMD layer to expose the top electrode layer

520 — Pattern the IMD layer to expose the ends of the first insulator film in the first capacitor region 525 — Pattern the IMD layer to expose the ends of the second insulator film in the first capacitor region 530 — Apply second metal layer upon substrate 535 — Pattern the second metal layer to form first capacitor and second capacitor 540 — Pattern the second metal layer to form metal pads to the capacitors 545 — Apply passivation layer over the substrate 550 — Remove the substrate below the piezoelectric region to form a backside cavity

FIG. 3D

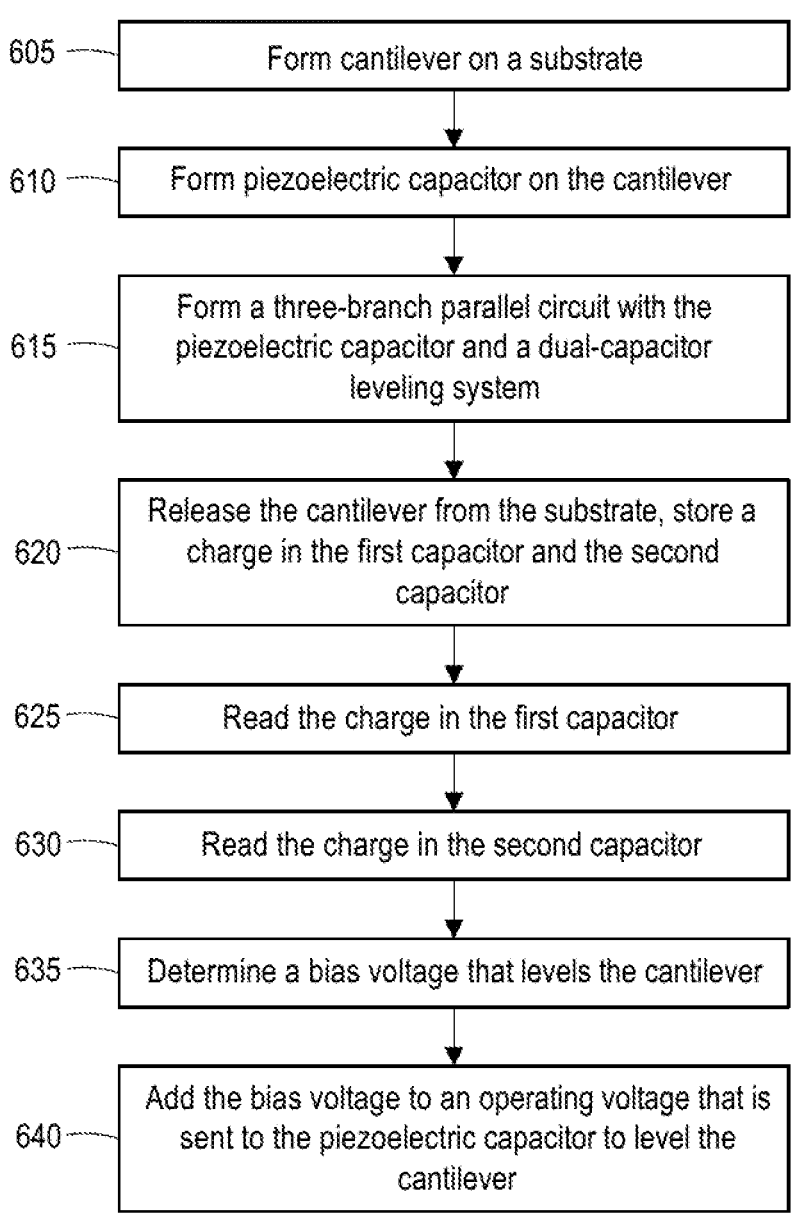

<u>600</u>

605 — Form cantilever on a substrate

610 — Form piezoelectric capacitor on the cantilever

615 — Form a three-branch parallel circuit with the piezoelectric capacitor and a dual-capacitor leveling system 620 — Release the cantilever from the substrate, store a charge in the first capacitor and the second capacitor 625 — Read the charge in the first capacitor 630 — Read the charge in the second capacitor 635 — Determine a bias voltage that levels the cantilever 640 — Add the bias voltage to an operating voltage that is sent to the piezoelectric capacitor to level the cantilever

FIG. 30

LEVELING SYSTEM FOR CANTILEVER CALIBRATION

BACKGROUND

Micro-electromechanical systems (MEMS) is a technology that employs miniature mechanical and electro-mechanical elements (e.g., devices or structures) on a wafer substrate. Utilizing micro-fabrication techniques, MEMS devices may range from relatively simple structures with no moving elements, to complex electro-mechanical systems utilizing a variety of moving elements under the control of an integrated microelectronic controller. Devices or structures that can be used in MEMS include microsensors, micro-actuators, microelectronics, and microstructures. MEMS devices may be used in a wide range of applications, including, for example and without limitation, motion sensors, pressure sensors, inertial sensors, micro-fluidic devices (e.g., valves, pumps, nozzle controls), optical devices, imaging devices (e.g., micromachined ultrasonic transducers ("MUT"s)), capacitive MUT ("CMUT") ultrasound transducers, and the like.

MEMS structures can be made using photolithographic patterning processes that use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D together form a flow chart illustrating a first method for forming a dual-capacitor leveling system, in accordance with some embodiments.

FIG. 30 is a flow chart illustrating a method for leveling a cantilever, in accordance with some embodiments.

DETAILED DESCRIPTION

Figure 1A:
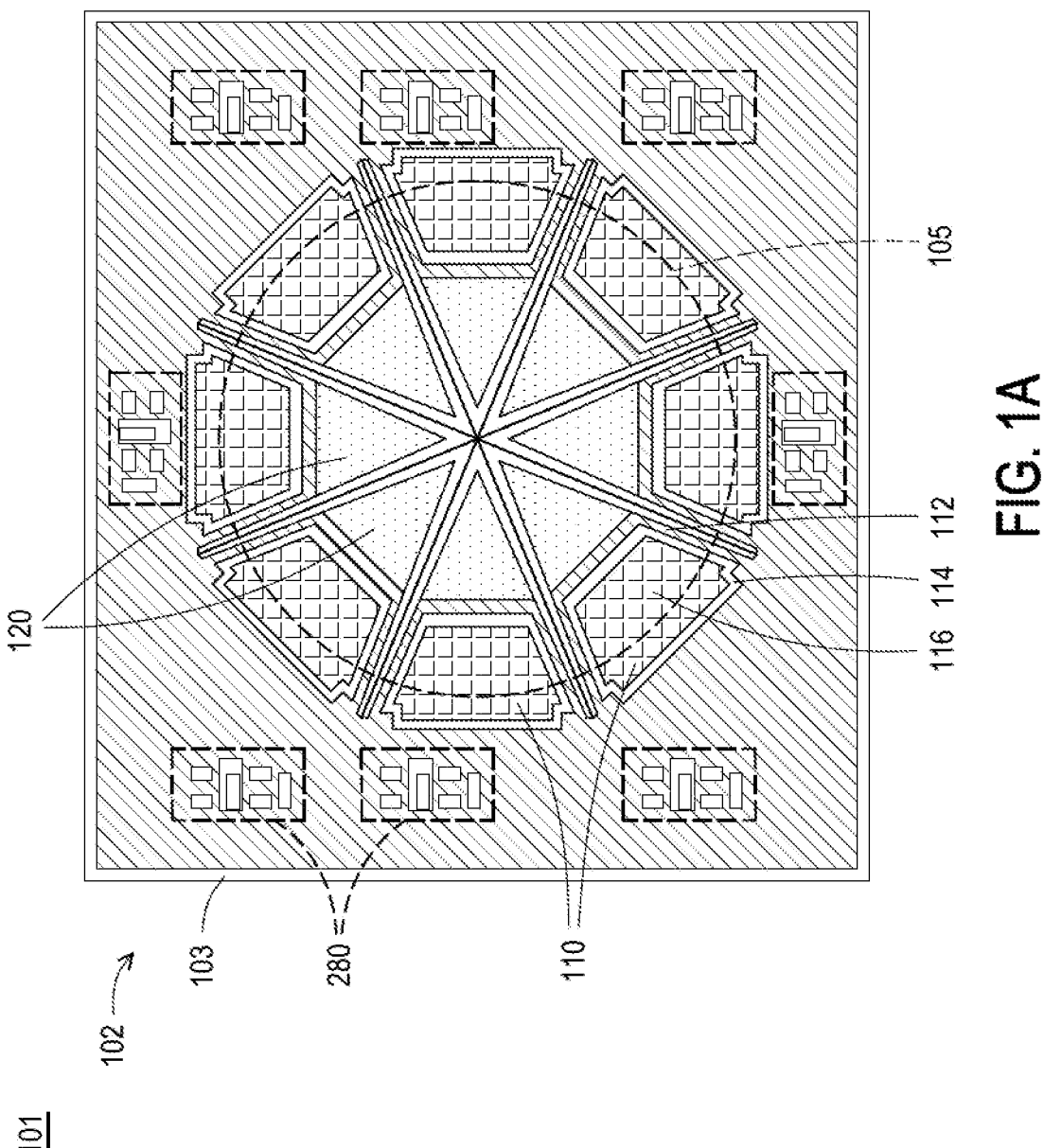
FIG. 1A is a plan view of a sensor system formed from eight cantilevers/membranes, and including eight dual-capacitor leveling systems (one for each cantilever).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them. In addition, when referring to performing process steps to the substrate or upon the substrate, this should be construed as performing such steps to whatever layers may be present on the substrate as well, depending on the context.

As used herein, the term "cantilever" refers to a projecting structure which is fixed at only one end.

The present disclosure relates to a dual-capacitor leveling system that is especially suited for use with micro-electro-mechanical system (MEMS) structures that can be used in various devices, such as cantilevers and membranes. Such structures are often unable to remain leveled (i.e. flat with respect to a given reference plane) after release due to residual stress or within-wafer variations in physical features caused by process tools. Such structures can be sensitive, and this inability leads to performance degradation, especially for applications that include multiple cantilevers/membranes whose leveling needs to be symmetrical. For example, roll-off, or inconsistency in operating voltages, or pressure loss during operation (which affects the sensor) can occur Time consuming post-calibration is then required after the dies on a wafer have been packaged, and each die is separately manually calibrated.

In the present disclosure, a new system is provided that is capable of determining the amount/degree of deformation, and the direction of the deformation (positive or negative), of the cantilever or membrane upon backside release. This is useful, for example, in actuator and/or sensor designs. An electrical signal is stored in two capacitors. When read, a bias voltage can be determined that is then included with the operation voltage to ensure consistent cantilever/membrane positioning during operation. The positional consistency also reduces the stress requirements of the cantilever/membrane material itself.

Figure 1B:
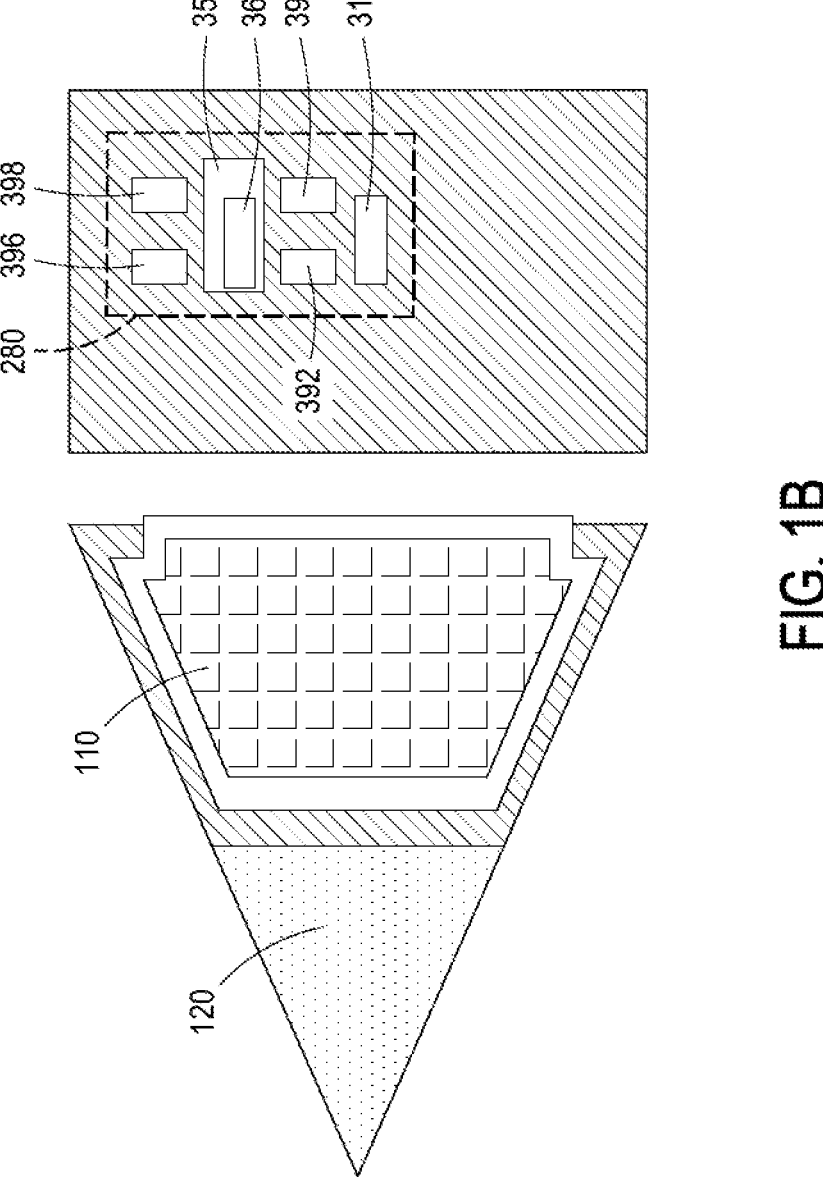
FIG. 1B is a magnified plan view of one membrane and one dual-capacitor leveling system.

FIG. 1A is a plan view of a first example embodiment of a MEMS structure 101 which acts as a sensor system, in accordance with some embodiments of the present disclosure. FIG. 1B is a magnified view of one section of the MEMS structure.

Referring first to FIG. 1A, in this example, the MEMS structure is formed on a die 102, which is defined by scribe lines 103. The structure illustrated here includes a plurality of cantilevers/membranes 120 which together form a sensor system (eight are illustrated). Each cantilever 120 is electrically connected to its own dual-capacitor leveling system 280. Each cantilever also includes a piezoelectric capacitor 110 thereon. Each piezoelectric capacitor 110 includes a bottom electrode layer 112, a piezoelectric layer 114, and a top electrode layer 116. As illustrated here, the bottom electrode layer 112 covers the surface of the die 102. The eight cantilevers 120 each have a triangular shape and meet in the center of an opening (dashed circle 105). The cantilevers can be used, in this example, to sense the passage of a fluid or gas through the opening. The cantilevers are usually formed as a single piece which is then etched into two or more separate pieces. However, this is only an example, and structures with only one cantilever/membrane are also contemplated.

Referring now to FIG. 1B, only one cantilever 120 and one dual-capacitor leveling system 280 is illustrated here. The piezoelectric capacitor 110 is visible. The dual-capacitor leveling system 280 includes a first capacitor 310, a diode 350, and a second capacitor 360 electrically connected to the diode. Two metal pads 392, 394 are electrically connected to provide a means for reading the charge stored in the first capacitor 310. Two metal pads 396, 398 are electrically connected to provide a means for reading the charge stored in the second capacitor 360.

Figure 2A:
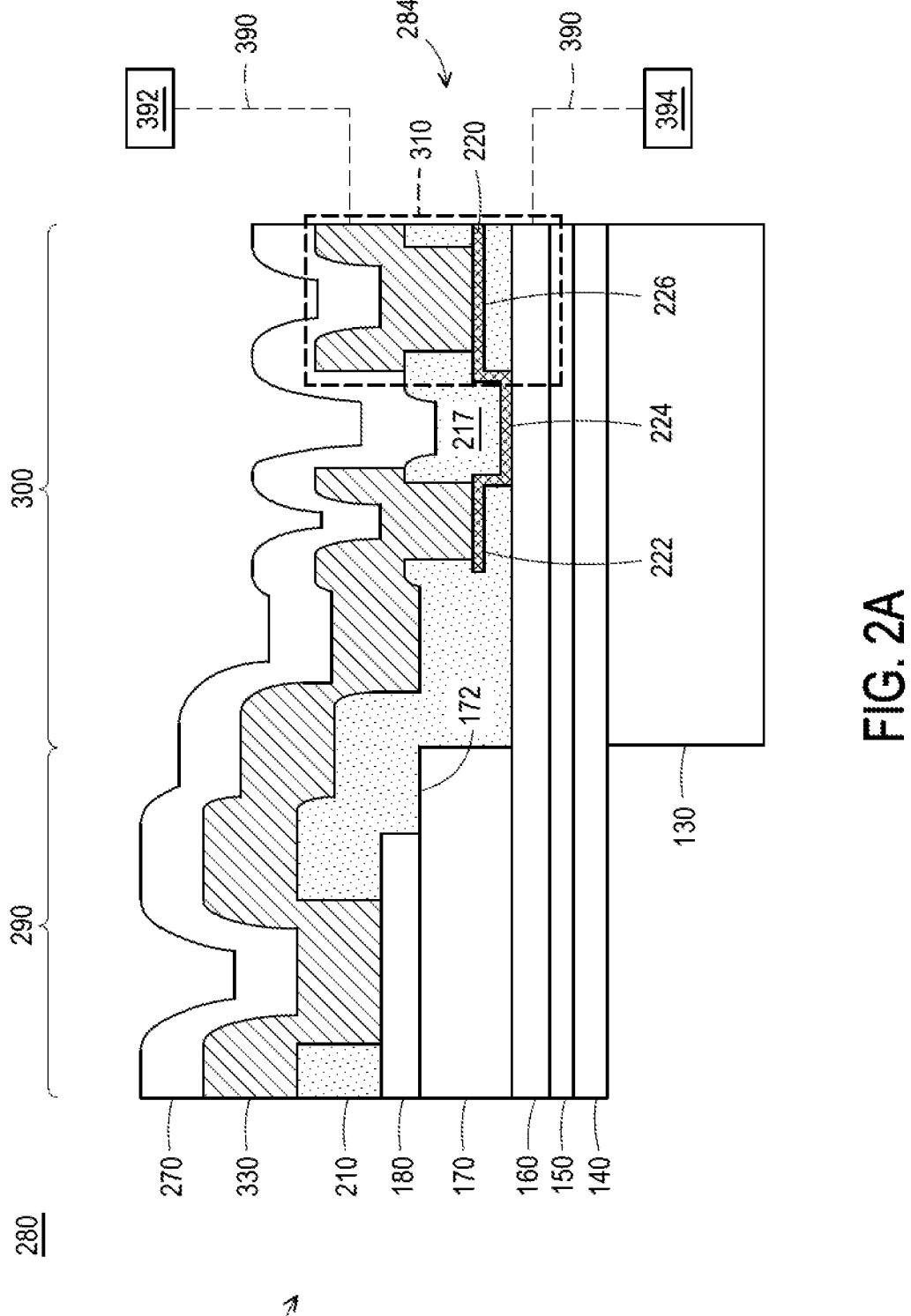
FIG. 2A is a side cross-sectional view of a first capacitor region 300 in the dual-capacitor leveling system that contains the first capacitor 310.

FIG. 2A is a side cross-sectional view of the dual-capacitor leveling system 280, showing a piezoelectric region 290 and a first capacitor region 300 that contains the first capacitor 310, in accordance with some embodiments of the present disclosure. Initially, a first dielectric layer 140 is present. An optional adhesion layer 150 is present upon the first dielectric layer 140. A bottom electrode layer 160 is present upon the first dielectric layer 140. These layers 140, 150, 160 extend from a first end 282 of the leveling system to a second end 284 of the leveling system. Referring back to FIG. 1B, the first end 282 of the leveling system is proximate the cantilever 120.

Continuing, then, the piezoelectric region 290 is proximate the first end 282 of the leveling system, while the first capacitor region 300 is proximate the second end 284 of the leveling system. In the piezoelectric region 290, a piezoelectric layer 170 contacts the bottom electrode layer 160 proximate the first end 282. A top electrode layer 180 also contacts the piezoelectric layer 170 proximate the first end 282. It is noted that an upper surface 172 of the piezoelectric layer 170 is exposed, but this is not required. It should also be noted that the bottom electrode layer 160, the piezoelectric layer 170, and the top electrode layer 180 of the dual-capacitor leveling system 280 are physically separated from the bottom electrode layer 112, the piezoelectric layer 114, and the top electrode layer 116 of the piezoelectric capacitor 110 seen in FIG. 1A and FIG. 1B. In the first capacitor region 300, the bottom electrode layer 160 is not covered by the piezoelectric layer 170 or the top electrode layer 180.

An intermetal dielectric (IMD) layer 210 is present that extends from the first end 282 of the leveling system to the second end 284 of the leveling system. The IMD layer 210 covers the top electrode layer 180 and the bottom electrode layer 160, with two areas removed so that the top electrode layer 180 is exposed through the IMD layer in the piezoelectric region 290 and the bottom electrode layer 160 is exposed through the IMD layer in the first capacitor region 300. As will be explained further herein, the IMD layer 210 is formed by deposition of multiple IMD sublayers at different points in the semiconductor manufacturing process.

A first insulator film 220 is present in the first capacitor region. The first insulator film includes a raised first end 222, a raised second end 226, and a central region 224 between the two ends. The central region 224 contacts the exposed portion of the bottom electrode layer 160, and may be considered to be lower in elevation than the two ends. The raised first end 222 and the raised second end 226 rest upon a portion of the IMD layer 210. A portion 217 of the IMD layer 210 is also present upon the central region 224 of the first insulator film. The first end 222 and the second end 226 of the first insulator film are exposed through the IMD layer.

Next, a primary metal layer 330 is present upon the IMD layer 210. The primary metal layer 330 also contacts the top electrode layer 180, the first end 222 of the first insulator film, and the second end 226 of the first insulator film through the IMD layer. Above the central region 224 of the first insulator film, a portion 217 of the IMD layer 210 is present that divides the primary metal layer 330 into two parts. A first metal-insulator-metal (MIM) capacitor 310 is thus formed from the primary metal layer 330, the combination of the first insulator film 220 and the IMD layer 210, and the bottom electrode layer 160. The first capacitor 310 is indicated by the box formed from dashed lines.

The top electrode layer 180 is electrically connected to the part of the primary metal layer 330 upon the first end 222 of the first insulator film. A passivation layer 270 formed from a dielectric material then covers the piezoelectric region 290 and the first capacitor region 300. Above the central region 224 of the first insulator film, the passivation layer 270 contacts the IMD layer 210 and separates the two parts of the primary metal layer 330.

As previously mentioned, two metal pads are provided to read the charge stored in the first capacitor 310. The first metal pad 392 is electrically connected to the primary metal layer 330. The second metal pad 394 is electrically connected to the bottom electrode layer 160 in the first capacitor region 300. They are connected via interconnects 390.

Continuing, the first dielectric layer 140 is located upon a substrate 130. The substrate 130 is present below the first capacitor region 300. However, the substrate is not present below the piezoelectric region 290.

Figure 2B:
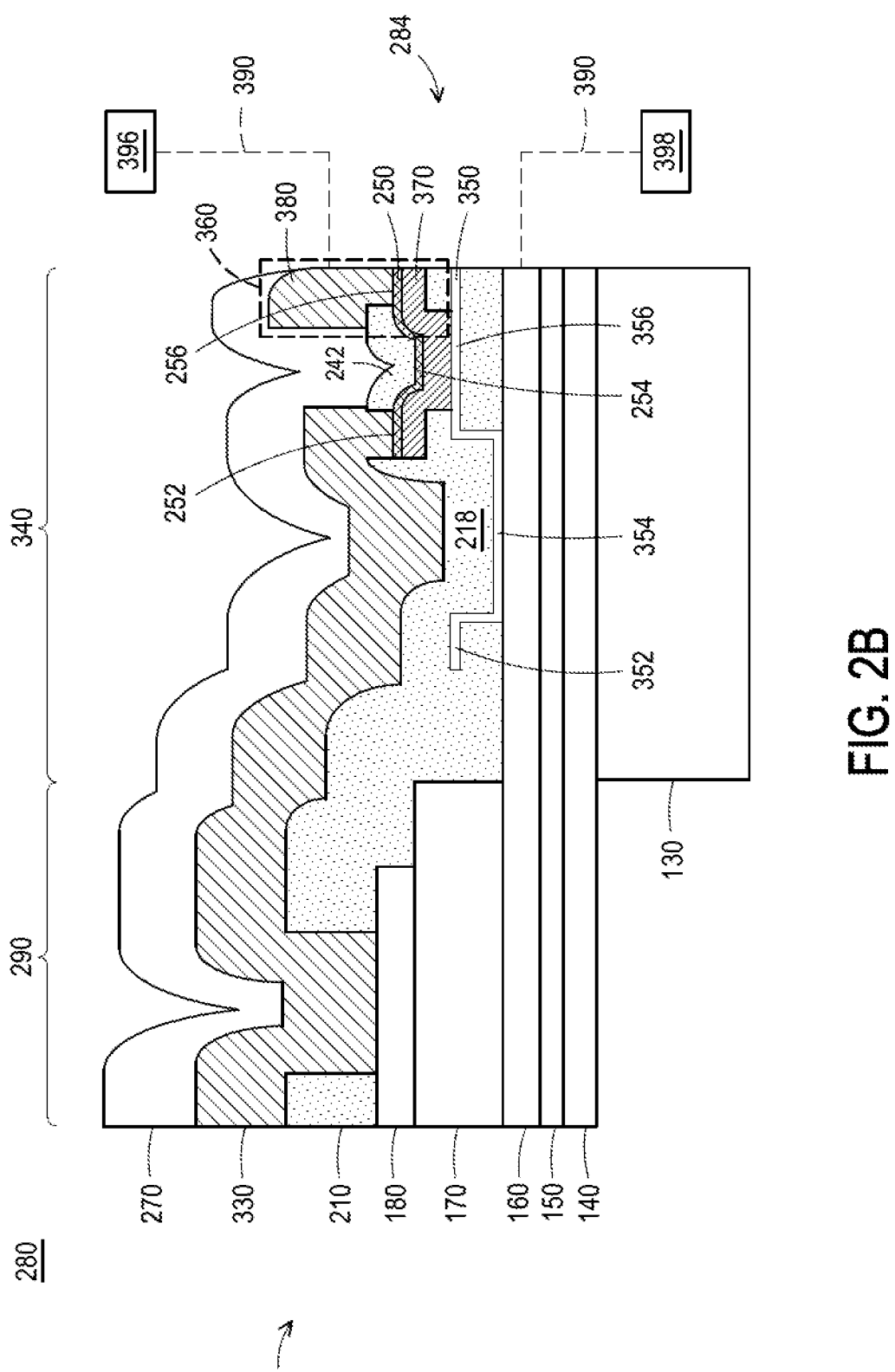
FIG. 2B is a side cross-sectional view of a second capacitor region 340 in the dual-capacitor leveling system that contains the second capacitor 360.

FIG. 2B is a side cross-sectional view of the dual-capacitor leveling system 280, showing the piezoelectric region 290 and a second capacitor region 340 that contains the second capacitor 360, in accordance with some embodiments of the present disclosure. Initially, the piezoelectric region 290 is proximate the first end 282 of the leveling system, while the second capacitor region 340 is proximate the second end 284. The first dielectric layer 140, optional adhesion layer 150, bottom electrode layer 160 are as previously described, as are the piezoelectric layer 170 and the top electrode layer 180 in the piezoelectric region. In the second capacitor region 340, the bottom electrode layer 160 is also not covered by the piezoelectric layer 170 or the top electrode layer 180. Again, the substrate 130 is present below the second capacitor region 340, but is not present below the piezoelectric region 290.

As seen in this cross-sectional view, the IMD layer 210 still extends from the first end 382 of the leveling system to the second end 384 of the leveling system. The IMD layer 210 still covers the top electrode layer 180 and the bottom electrode layer 160, with two areas removed so that the top electrode layer 180 is exposed through the IMD layer in the piezoelectric region 290 and the bottom electrode layer 160 is exposed through the IMD layer in the second capacitor region 340.

A diode 350 is present in the second capacitor region. The diode includes a raised first end 352, a raised second end 356, and a central region 354 between the two ends. The central region 354 contacts the exposed portion of the bottom electrode layer 160, and may be considered to be lower in elevation than the two ends. The raised first end 352 and the raised second end 356 rest upon a portion of the IMD layer 210. A 218 portion of the IMD layer is also present upon the central region 354 of the diode. One end of the diode is exposed through the IMD layer, and the other end of the diode remains covered by the IMD layer. As illustrated here, the second end 356 is exposed.

A secondary metal layer 370 contacts the exposed end of the diode. A second insulator film 250 covers the secondary metal layer 370. The second insulator film 250 includes a first end 252, a second end 256, and a central region 254 between the two ends. A tertiary metal layer 380 is present that contacts the top electrode layer 180, the first end 252 of the second insulator film, and the second end 256 of the second insulator film through the IMD layer. Above the central region 254 of the second insulator film, a portion 242 of the IMD layer 218 is present that divides the tertiary metal layer 380 into two parts. A second MIM capacitor 360 is thus formed from the secondary metal layer 370, the second insulator film 250, and the tertiary metal layer 380. The second capacitor 360 is indicated by a box formed from dashed lines.

The top electrode layer 180 is electrically connected to the part of the tertiary metal layer 380 upon the first end 252 of the second insulator film. The passivation layer 270 covers the piezoelectric region 290 and the second capacitor region 340. Above the central region 254 of the second insulator film, the passivation layer 270 contacts the IMD layer 210 and separates the two parts of the tertiary metal layer 380.

As previously mentioned, two more metal pads are provided to read the charge stored in the second capacitor 360. The third metal pad 396 is electrically connected to the tertiary metal layer 380. The fourth metal pad 398 is electrically connected to the bottom electrode layer 160 in the second capacitor region 340. They are connected via interconnects 390. It is noted that the electrical circuit thus passes through both the second capacitor 360 and the diode 350.

Figure 2C:
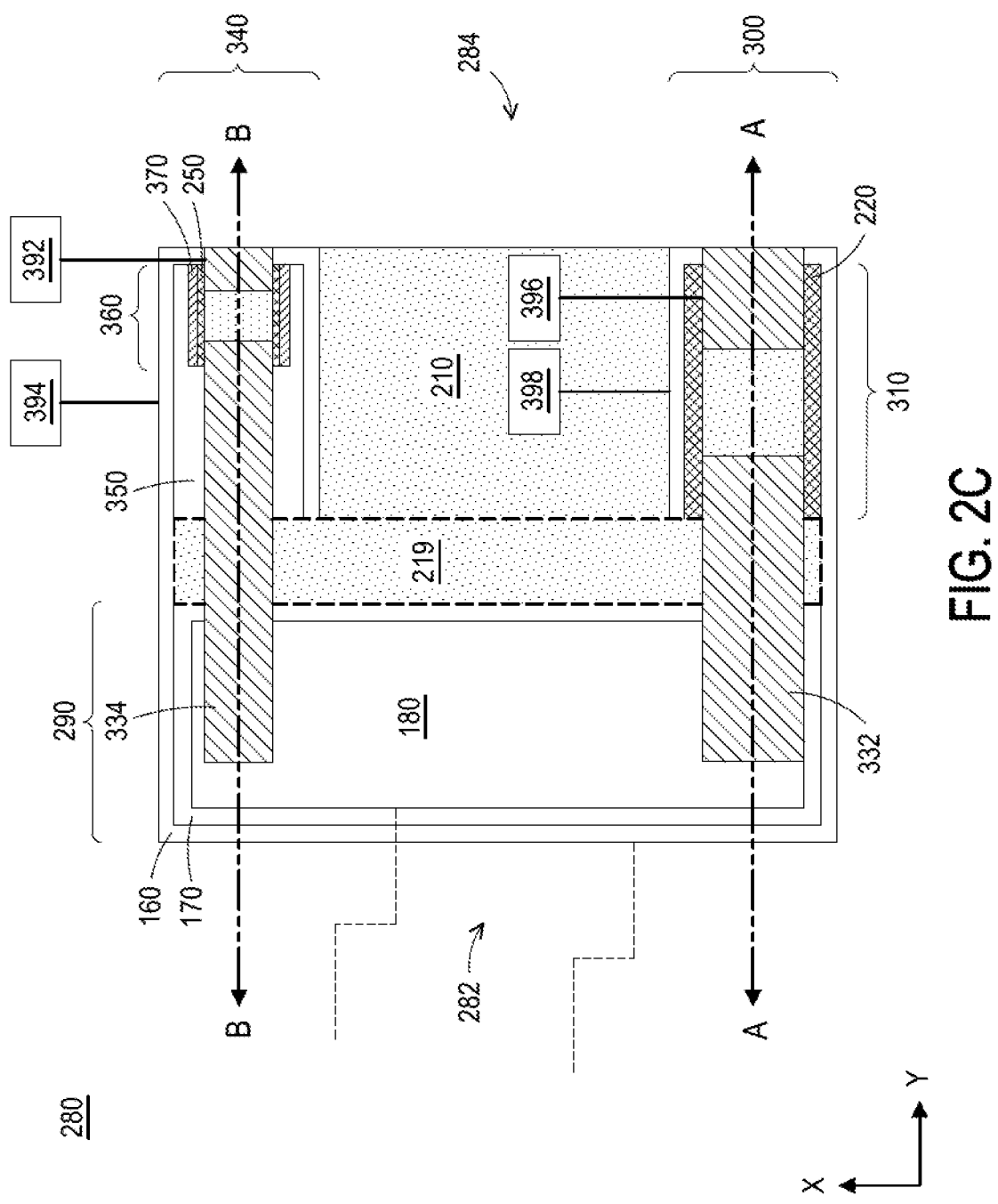
FIG. 2C is an illustrative plan view showing the various layers of each component and their arrangement in the dual-capacitor leveling system.

FIG. 2C is a schematic plan view showing the various layers of each component and their arrangement in the dual-capacitor leveling system 280, in accordance with some embodiments of the present disclosure. This view is manipulated so that all of the layers are visible, and should not be interpreted as providing information on the relative surface area of each layer/components or as the various components having a pyramidal shape in the actual structure. In addition, the passivation layer 270 is omitted. As a result, the illustration of the components in this plan view will not strictly correspond to the side views of FIG. 2A and FIG. 2B.

In FIG. 2C, the piezoelectric region 290 is shown at the first end 282. The first capacitor region 300 and the second capacitor region 340 are separated in the X-axis by the IMD layer 210, such that the first capacitor 310 and the second capacitor 360 are electrically isolated from each other (other than through the piezoelectric region 290 and the bottom electrode layer 160). An IMD region 219 separates the piezoelectric layer 170 from the first insulator film 220 and the second insulator film 250 in the X-axis. The primary metal layer 330 is split into two sections. One section 332 electrically connects the top electrode layer 180 to the first capacitor 310, and one section 334 electrically connects the top electrode layer 180 to the second capacitor 360.

The four metal pads 392, 394, 396, 398 are accessible from above, which is useful for both Wafer Acceptance Testing (WAT) and for calibration. It is noted that the location of the four metal pads relative to the two capacitors 310, 360 is not significant, so long as they are electrically connected to the two capacitors 310, 360 as previously described.

Line A-A passes through the piezoelectric region 290 and the first capacitor region 300. Line B-B passes through the piezoelectric region 290 and the second capacitor region 340.

Figure 2D:
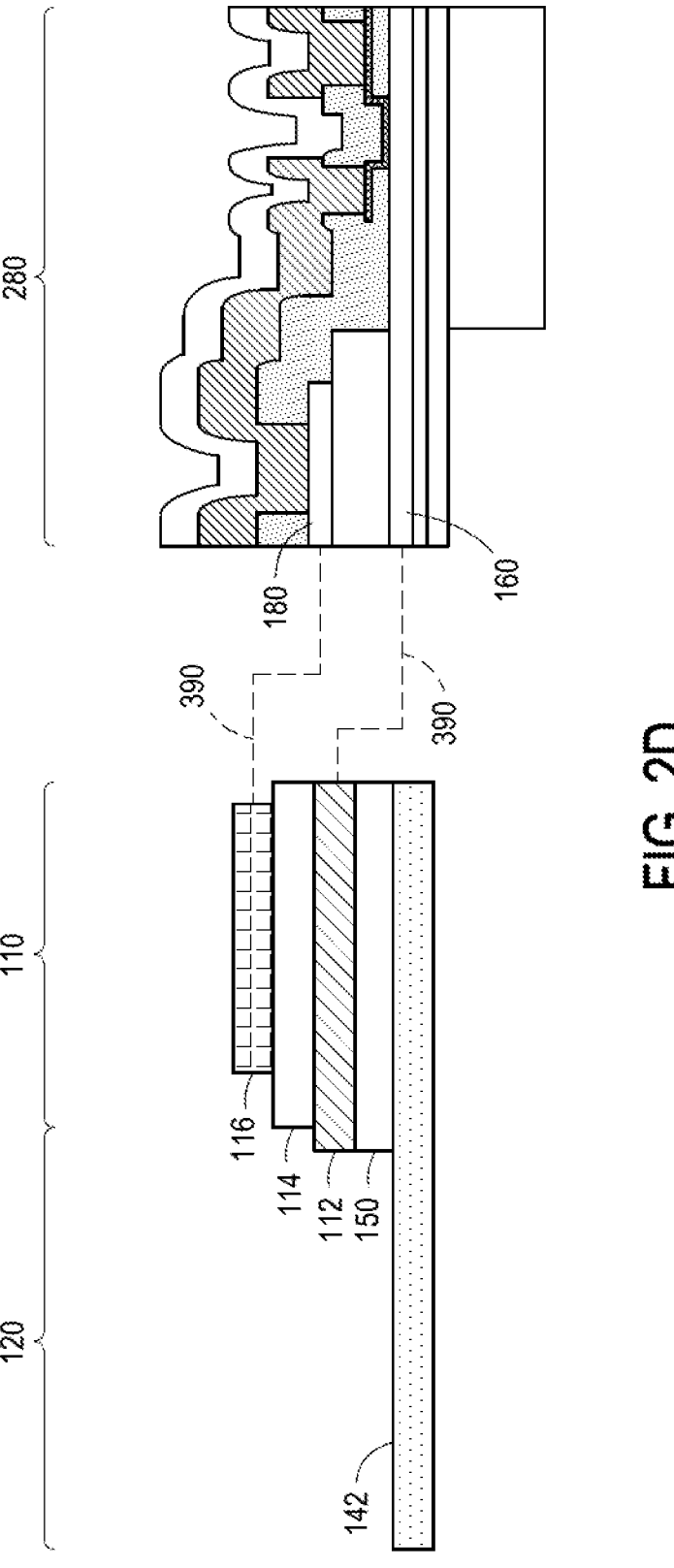
FIG. 2D is a side cross-sectional view illustrating electrical interconnections between a piezoelectric capacitor on the cantilever/membrane, and the dual-capacitor leveling system.

FIG. 2D is a side cross-sectional view illustrating electrical interconnections between the piezoelectric capacitor 110 on the cantilever/membrane 120, and the dual-capacitor leveling system 280. Referring to both FIG. 2C and FIG. 2D, the top electrode layer 116 of the piezoelectric capacitor 110 is electrically connected to the top electrode layer 180 of the piezoelectric region 290 in the dual-capacitor leveling system 280. Similarly, the bottom electrode layer 112 of the piezoelectric capacitor 110 is electrically connected to the bottom electrode layer 160 of the piezoelectric region 290 in the dual-capacitor leveling system 280. The piezoelectric capacitor 110 is physically separated from the dual-capacitor leveling system 280. These electrical interconnections between the piezoelectric capacitor 110 and the dual-capacitor leveling system 280 may pass, for example, through AlCu interconnects in an interconnect layer such as a redistribution layer (RDL). Here, the cantilever 120 is shown as being formed from a second dielectric layer 142, which can be different from the first dielectric layer 140.

FIGS. 3A-3D together form a flow chart illustrating a first method 400 for making a dual-capacitor leveling system for a cantilever, in accordance with some embodiments. Some steps of the method are also illustrated in FIGS. 4-28. These figures provide different views for better understanding. While the method steps are discussed below in terms of forming a single leveling system, such discussion should also be broadly construed as applying to the concurrent formation of multiple leveling systems.

Figure 3B:
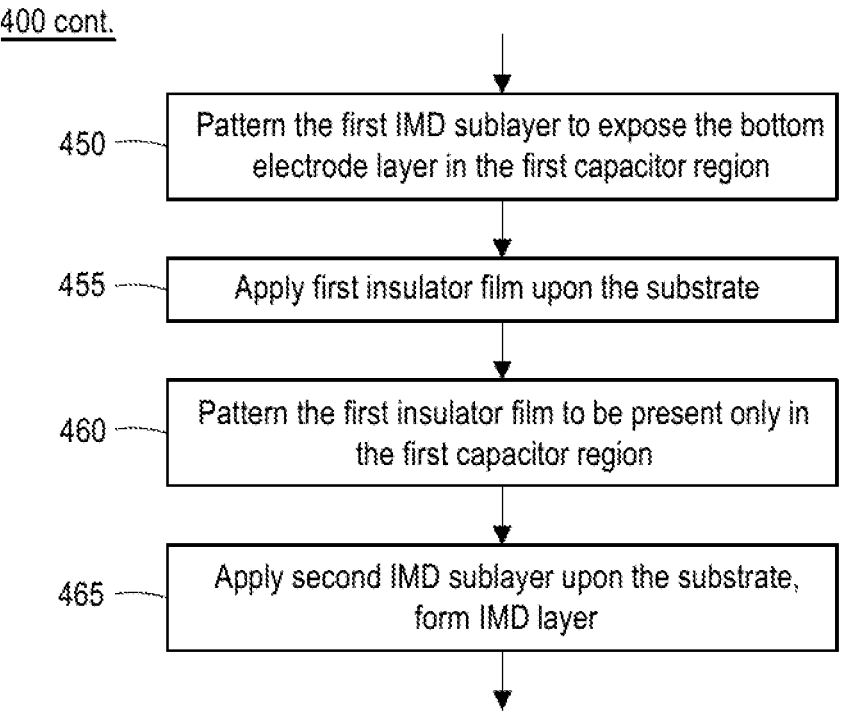
Figures 4, 5:
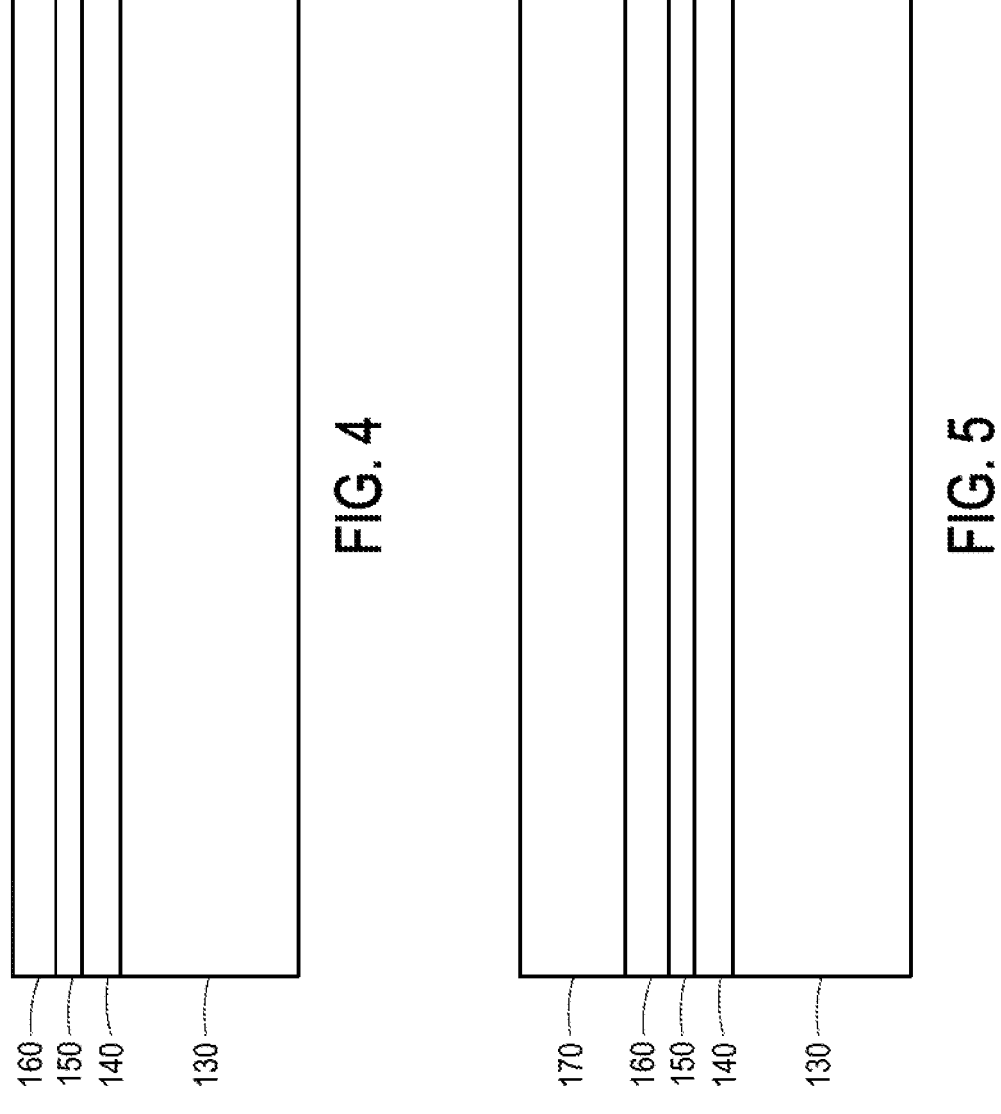
FIG. 4 is a Y-axis cross-sectional view through line A-A of FIG. 2C after a first dielectric layer, an adhesion layer, and a bottom electrode layer are formed upon a substrate.
FIG. 5 is a Y-axis cross-sectional view through line A-A of FIG. 2C after a piezoelectric layer is formed upon the bottom electrode layer.

In step 405 of FIG. 3A, and referring to FIG. 4, a first dielectric layer 140 is formed upon a substrate 130. In optional step 410, an adhesion layer 150 is formed upon the first dielectric layer. Then, in step 415, a bottom electrode layer 160 is formed upon the adhesion layer, or over the first dielectric layer. FIG. 4 shows the resulting structure, and includes the optional adhesion layer.

The substrate 130 may be, for example, a wafer made of a semiconducting material. Such semiconductor materials can include silicon, for example in the form of crystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the substrate is silicon. Referring back to FIG. 1A, it is noted that while the entire die is generally made upon a substrate, for purposes of discussion of making the dual-capacitor leveling system, the term "substrate" should be interpreted as referring only to the portion of the wafer where the leveling system is made, and not necessarily the entire wafer itself. For example, a photoresist layer may be applied to areas of the wafer where the leveling system is not going to be made.

The first dielectric layer 140 may be formed by any suitable means, including chemical vapor deposition (CVD), physical vapor deposition (PVD), atomic layer deposition (ALD), thermal oxidation, or other suitable methods. In particular embodiments, the first dielectric layer is made of silicon dioxide ($SiO_2$). In some embodiments, the first dielectric layer has a thickness of about 1 micrometer to about 3 micrometers, although other ranges and values are within the scope of this disclosure.

The optional adhesion layer 150 aids in preventing separation or peeling of the bottom electrode layer 160 from the first dielectric layer 140. The adhesion layer may also have dielectric properties. In some embodiments, the adhesion layer is made from a material that can also act as a barrier layer to reduce or prevent diffusion of the bottom electrode material into the first dielectric layer 140. Some non-limiting examples of suitable materials for the adhesion layer include titanium dioxide ($TiO_2$) and aluminum oxide ($Al_2O_3$). In some embodiments, the adhesion layer has a thickness of about 200 angstroms to about 1500 angstroms, although other ranges and values are within the scope of this disclosure. The adhesion layer can also be formed by CVD, PVD, or other suitable methods.

The bottom electrode layer 160 may generally be formed from any conductive metal or conductive oxide. Examples of suitable metals may include copper, aluminum, nickel, chromium, gold, germanium, silver, titanium, tungsten, platinum, tantalum, ruthenium, cobalt, rhenium, palladium, or zirconium; composites like TiN, WN, or TaN; or alloys thereof like AlCu. Examples of suitable conductive oxides may include indium tin oxide (ITO), zinc oxide (ZnO), tin oxide (SnO), aluminum zinc oxide (AlZnO), indium oxide (InO), or cadmium oxide (CdO). The bottom electrode material may be deposited, for example, via evaporation or sputtering, plating, chemical vapor deposition (CVD), physical vapor deposition (PVD), atomic layer deposition (ALD), or other suitable methods. In some embodiments, the bottom electrode layer has a thickness of about 1000 angstroms to about 3000 angstroms. In further embodiments, the bottom electrode layer has a resistance of less than 1000 ohm/sq. Other ranges and values for each of these properties are within the scope of this disclosure.

Next, in step 420 of FIG. 3A and as illustrated in FIG. 5, a piezoelectric layer 170 is formed upon the bottom electrode layer 160. The piezoelectric layer is usually formed from a piezoelectric ceramic. Examples of suitable ceramic materials may include lead zirconium titanate (PZT), aluminum nitride (AlN), potassium sodium niobate (KNN), or barium titanate (BTO). The piezoelectric layer may be made, for example via PVD or sol-gel deposition. In some embodiments, the piezoelectric layer has a thickness of about 0.5 micrometers to about 3 micrometers, although other ranges and values are within the scope of this disclosure.

Figures 6, 7:
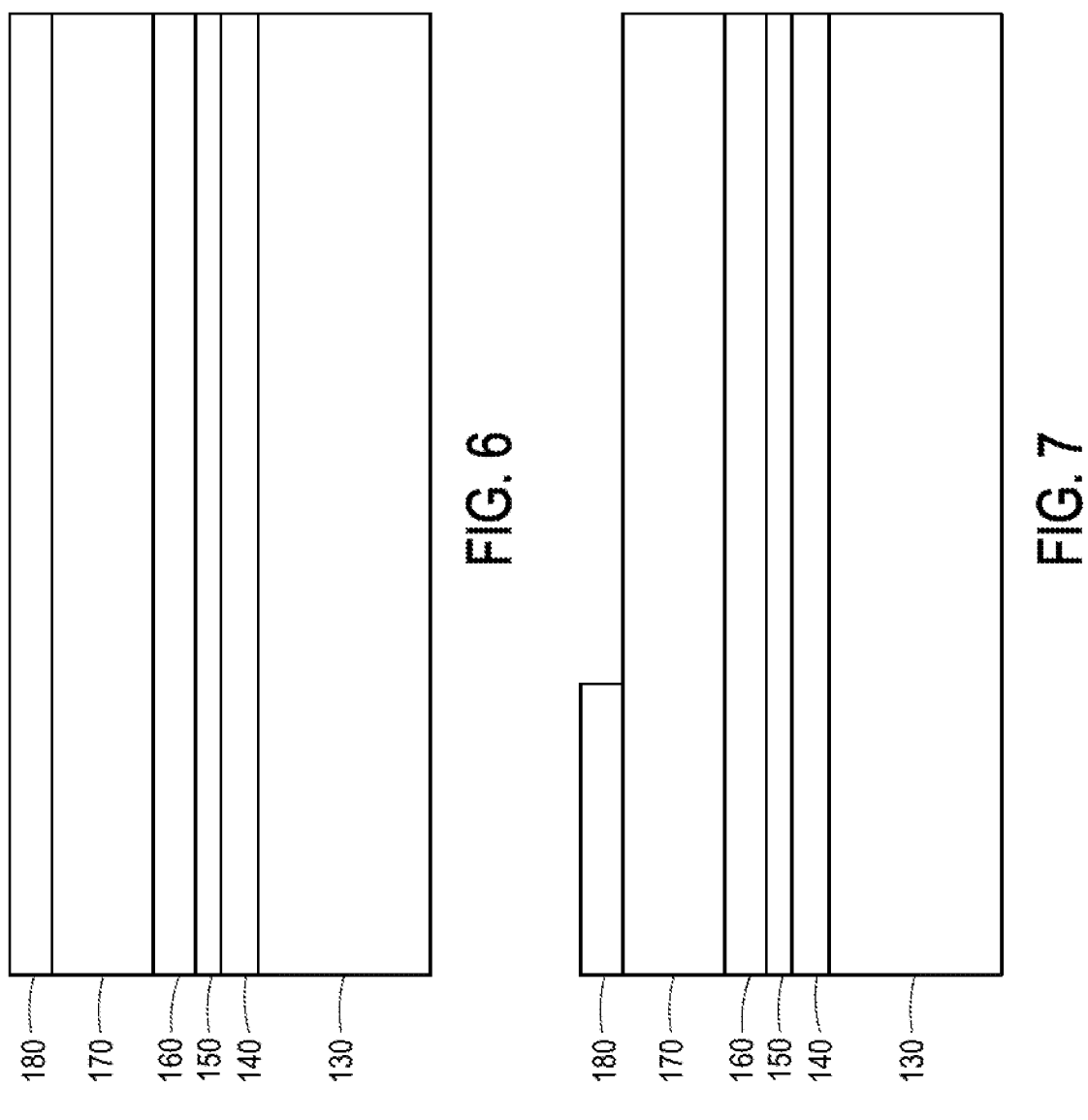
FIG. 6 is a Y-axis cross-sectional view through line A-A of FIG. 2C after a top electrode layer is formed upon the piezoelectric layer.
FIG. 7 is a Y-axis cross-sectional view through line A-A of FIG. 2C after the top electrode layer has been patterned to expose the piezoelectric layer.

Next, in step 425 of FIG. 3A and as illustrated in FIG. 6, a top electrode layer 180 is formed upon the piezoelectric layer 170. The discussion of the bottom electrode layer applies here in all respective.

Figure 8:
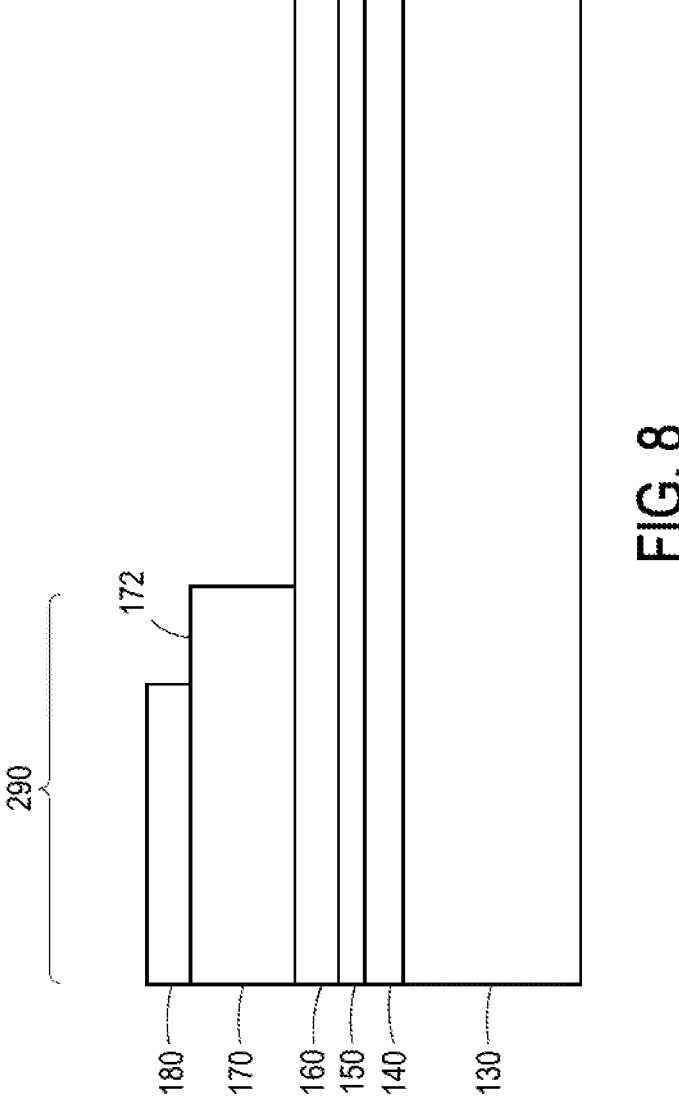
FIG. 8 is a Y-axis cross-sectional view through line A-A of FIG. 2C after the piezoelectric layer has been patterned to expose the bottom electrode layer.

Then, in optional step 430 of FIG. 3A, and as shown in FIG. 7, the top electrode layer 180 is patterned. Next, in optional step 435 of FIG. 3A, and as shown in FIG. 8, the piezoelectric layer 170 is patterned. The patterning is usually performed by dry etching. As a result, the bottom electrode layer 160 is exposed from above. The section that still includes the piezoelectric layer 170 and the top electrode layer 180 forms the piezoelectric region 290 of the dual-capacitor leveling system.

It is noted that in FIG. 8, a portion of the upper surface 172 of the piezoelectric layer 170 is also exposed, however this is not necessary. It is also noted that the two patterning steps are optional. For example, the same resulting structure could be obtained by applying a photoresist layer proximate the second end 284 of the substrate and only forming the piezoelectric layer 170 and the top electrode layer 180 in the desired location.

Next, in step 440 of FIG. 3A, the bottom electrode layer 160 is patterned and etched at the sides of the die. Referring back to FIG. 1A, this etching occurs along scribe lines 103, and aids in later separating the individual dies on the wafer from each other.

Figure 9A:
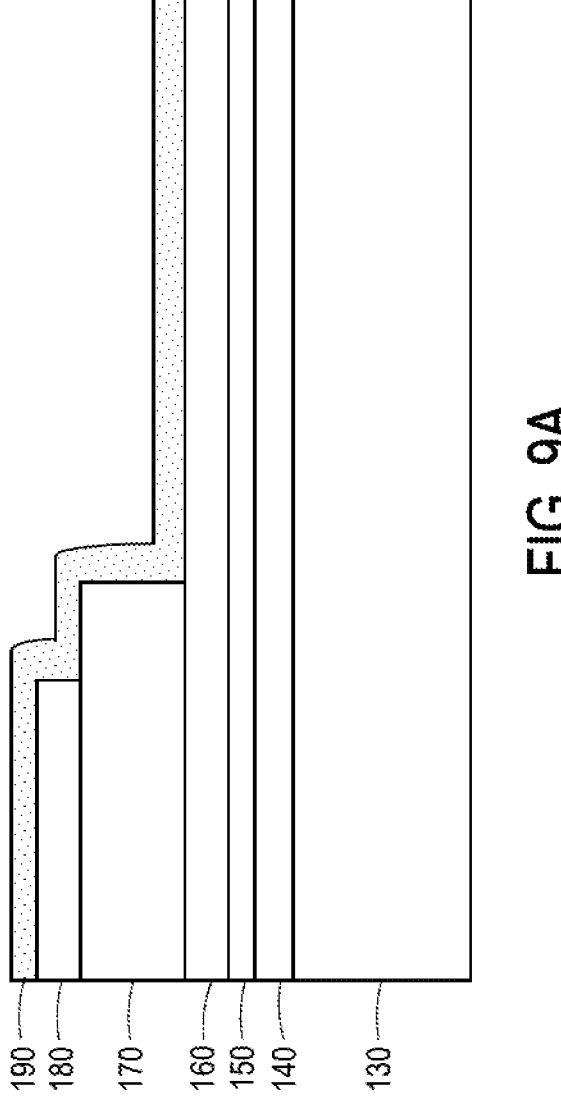
FIG. 9A is a Y-axis cross-sectional view through line A-A of FIG. 2C after a first intermetal dielectric (IMD) sublayer is applied over the substrate.
Figure 9B:
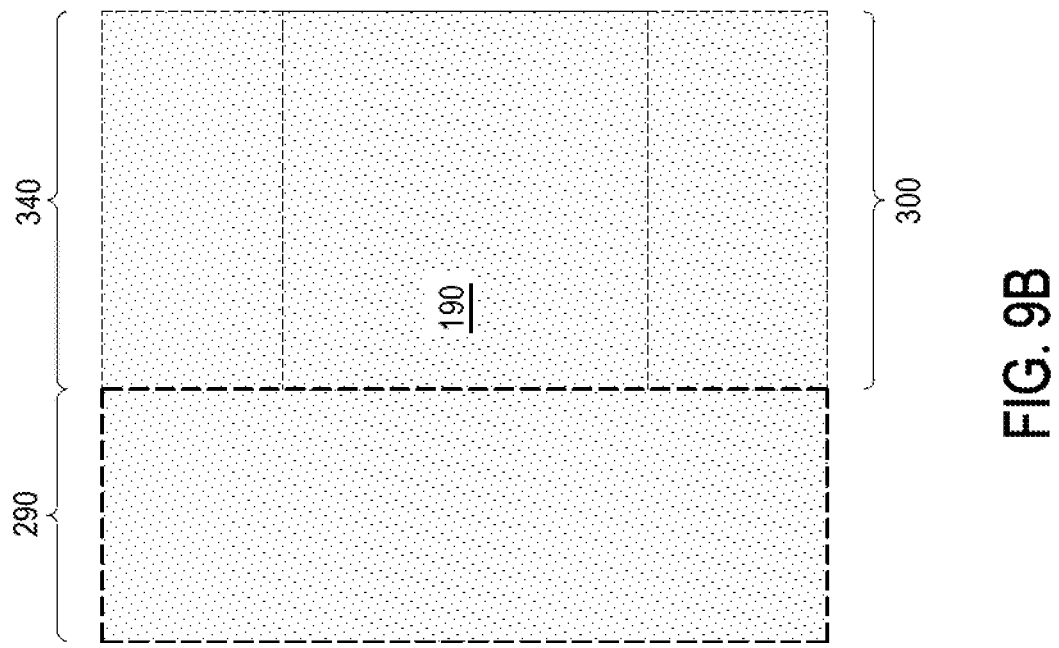
FIG. 9B is a corresponding illustrative plan view.

Continuing, in step 445 of FIG. 3A and as illustrated in FIG. 9A and FIG. 9B, a first intermetal dielectric (IMD) sublayer 190 is applied upon the substrate. The first IMD sublayer 190 is a conformal layer that covers the top electrode layer 180, the piezoelectric layer 170, and the bottom electrode layer 160. In particular embodiments, the IMD material is silicon dioxide ($SiO_2$). The first IMD sublayer may be formed by any suitable means, including CVD or PVD. In some embodiments, the first IMD sublayer has a thickness of about 1000 angstroms to about 3000 angstroms, although other ranges and values are within the scope of this disclosure.

FIG. 9B is an illustrative plan view showing the various layers at this point in the manufacturing process. As illustrated here, and referring back to FIG. 2C, the piezoelectric region 290 containing the piezoelectric layer and the top electrode layer is indicated at one end of the substrate as a dashed-line box. The first capacitor region 300 and the second capacitor region 340 are also indicated as dashed-line boxes. The first IMD sublayer 190 covers the entire surface of the substrate.

Figure 10:
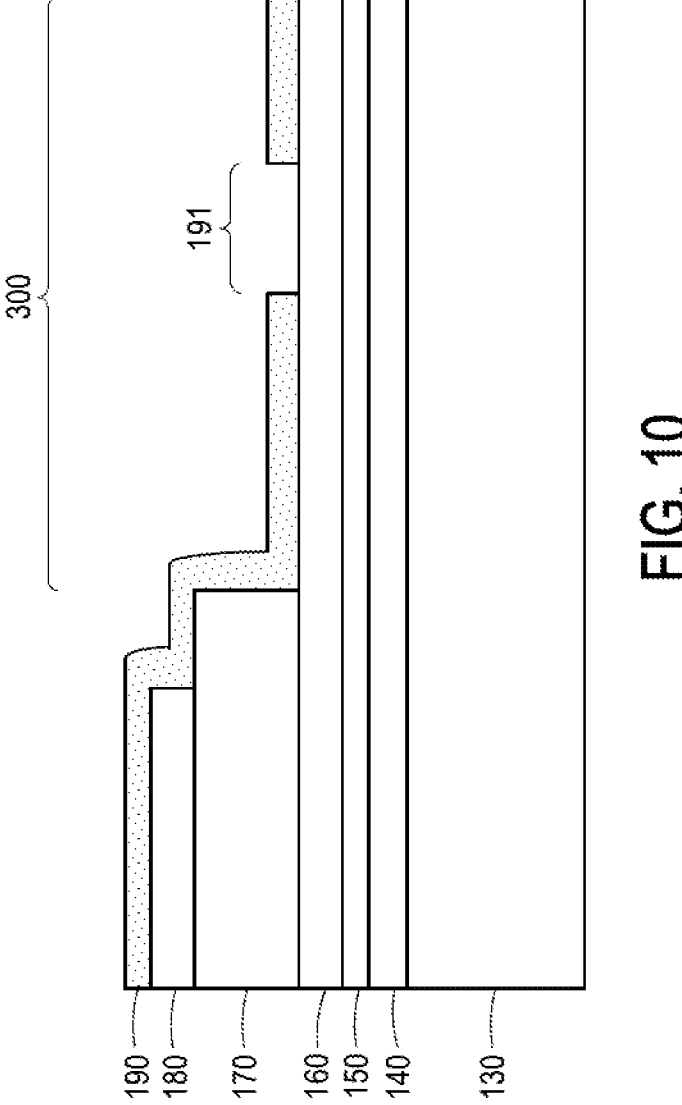
FIG. 10 is a Y-axis cross-sectional view through line A-A of FIG. 2C showing the first capacitor region after the first IMD layer is etched to expose a portion of the bottom electrode layer.

Continuing, then, in step 450 of FIG. 3B and as illustrated in FIG. 10, the first IMD sublayer 190 is patterned to expose the bottom electrode layer 160 in the first capacitor region 300. Recess 191 in the first IMD sublayer is visible here.

Figure 11:
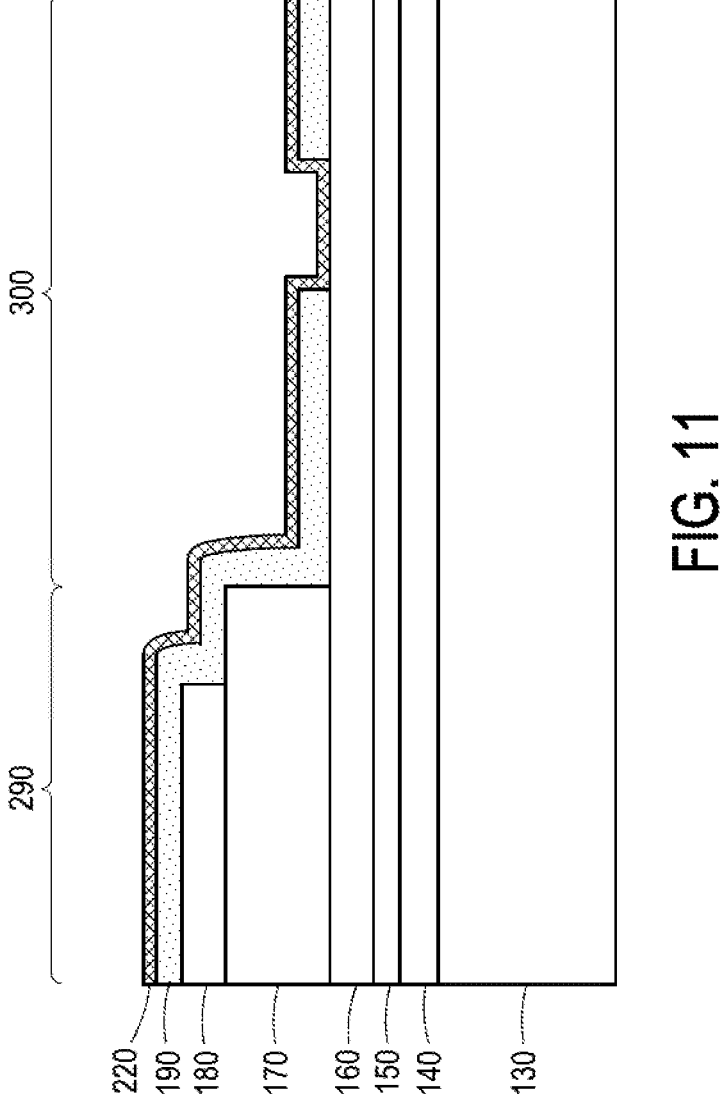
FIG. 11 is a Y-axis cross-sectional view through line A-A of FIG. 2C showing the first capacitor region after a first insulator film is applied over the substrate.

Next, in step 455 of FIG. 3B and as illustrated in FIG. 11, a first insulator film 220 is applied upon the substrate. As illustrated here, the first insulator film is a conformal film that covers the piezoelectric region 290 and the first capacitor region 300. The first insulator film is a dielectric material. Examples of suitable materials may include hafnium dioxide ($HfO_2$) or zirconium dioxide ($ZrO_2$), though other dielectric materials may be used. The first insulator film may be formed by any suitable means, such as ALD. In some embodiments, the first insulator film has a thickness of about 200 angstroms to about 500 angstroms, although other ranges and values are within the scope of this disclosure.

Figure 12:
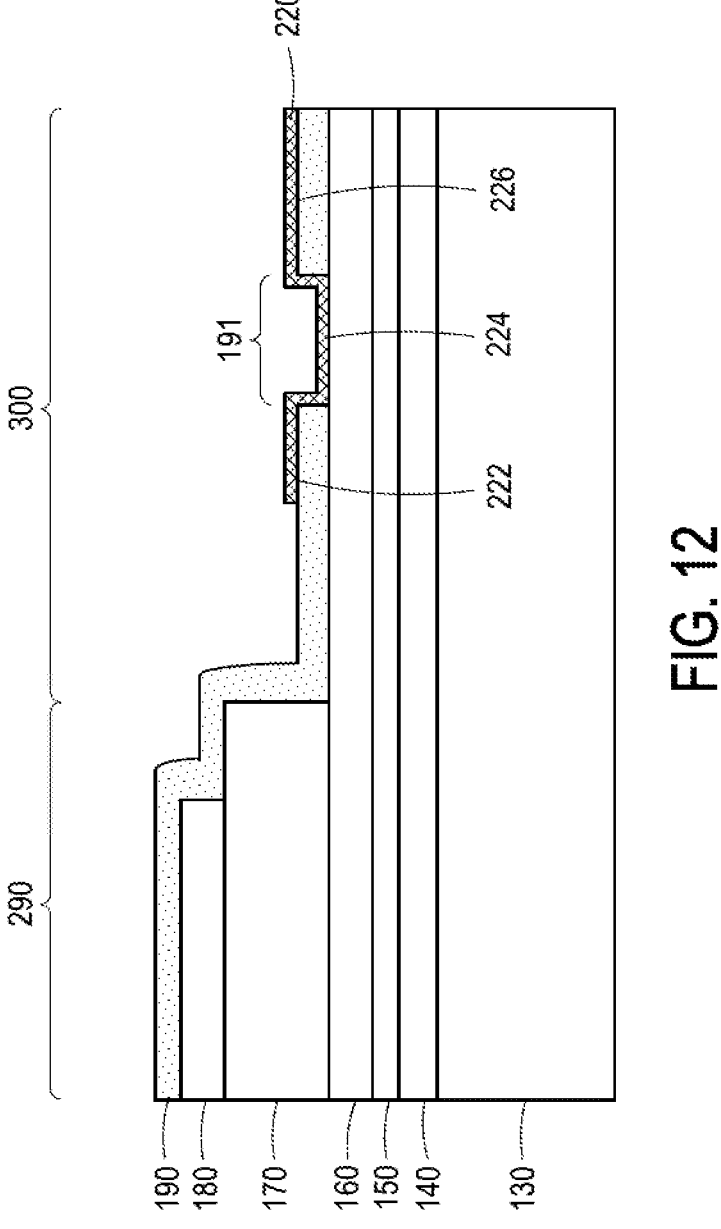
FIG. 12 is a Y-axis cross-sectional view through line A-A of FIG. 2C showing the first capacitor region after the first insulator film is patterned.

Continuing, in step 460 of FIG. 3B and as illustrated in FIG. 12, the first insulator film is patterned, so that the first insulator film is only present in the first capacitor region 300. As seen here, the first insulator film 220 remains within the recess 191 and upon the portions of the first IMD sublayer 190 adjacent the recess. The first insulator film may be described as including a first end 222, a central region 224, and a second end 226 which are joined together. The first end and the second end may also be referred to as "raised ends", and/or the central region can be referred to as a "lower central region".

Figure 13A:
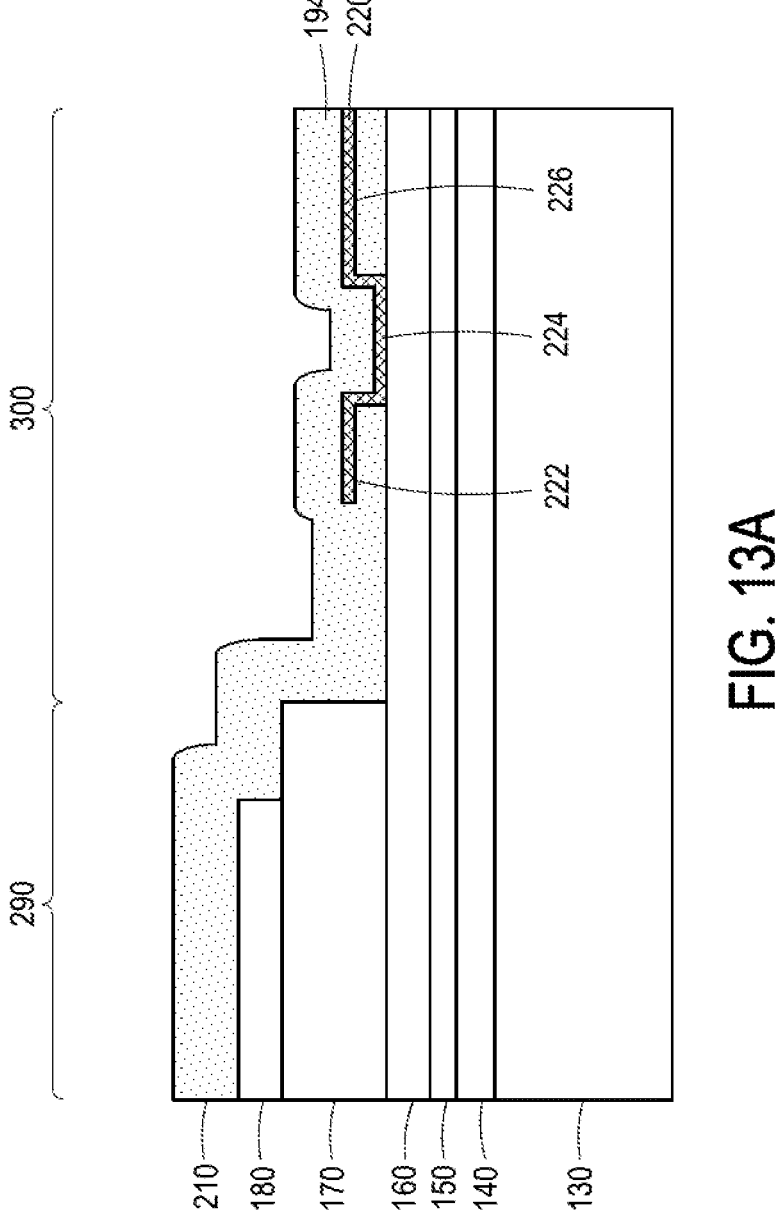
FIG. 13A is a Y-axis cross-sectional view through line A-A of FIG. 2C showing the first capacitor region after a second IMD sublayer is applied over the substrate. The first insulator film is thus covered by the second IMD sublayer.

Then, in step 465 of FIG. 3B and as illustrated in FIG. 13A, a second IMD sublayer 194 is applied upon the substrate. As seen in FIG. 13A, the second IMD sublayer 194 covers the first insulator film 220 in the first capacitor region 300. The second IMD sublayer is also a conformal layer and may be formed by any suitable means, including CVD or PVD. In some embodiments, the second IMD sublayer has a thickness of about 1000 angstroms to about 3000 angstroms, although other ranges and values are within the scope of this disclosure. It is noted that the two IMD sublayers form a thicker IMD layer 210 in the piezoelectric region 290.

Figure 13B:
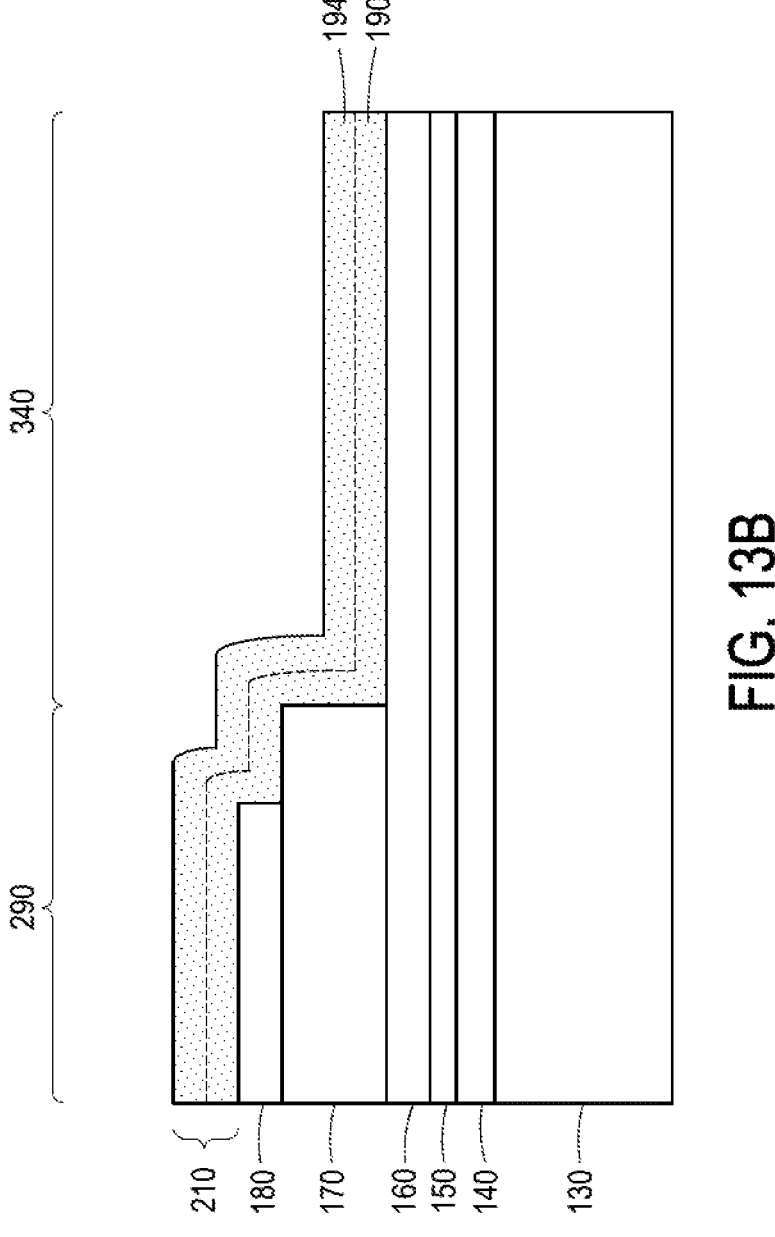
FIG. 13B is a Y-axis cross-sectional view showing the second capacitor region after the second IMD sublayer is applied over the substrate.

Continuing, FIG. 13B shows the second capacitor region 340 after the second IMD sublayer has been applied upon the substrate. In this regard, it is noted that the various layers applied to the first capacitor region during steps 455-465 were also applied to the second capacitor region. The first IMD sublayer 190 acted as an etch stop layer during the patterning of the first insulator film. Thus, the IMD layer 210 in the second capacitor region at this stage is formed from the combination of the first IMD sublayer 190 and the second IMD sublayer 194. A dashed line is added to show the contribution from each sublayer.

Figure 14:
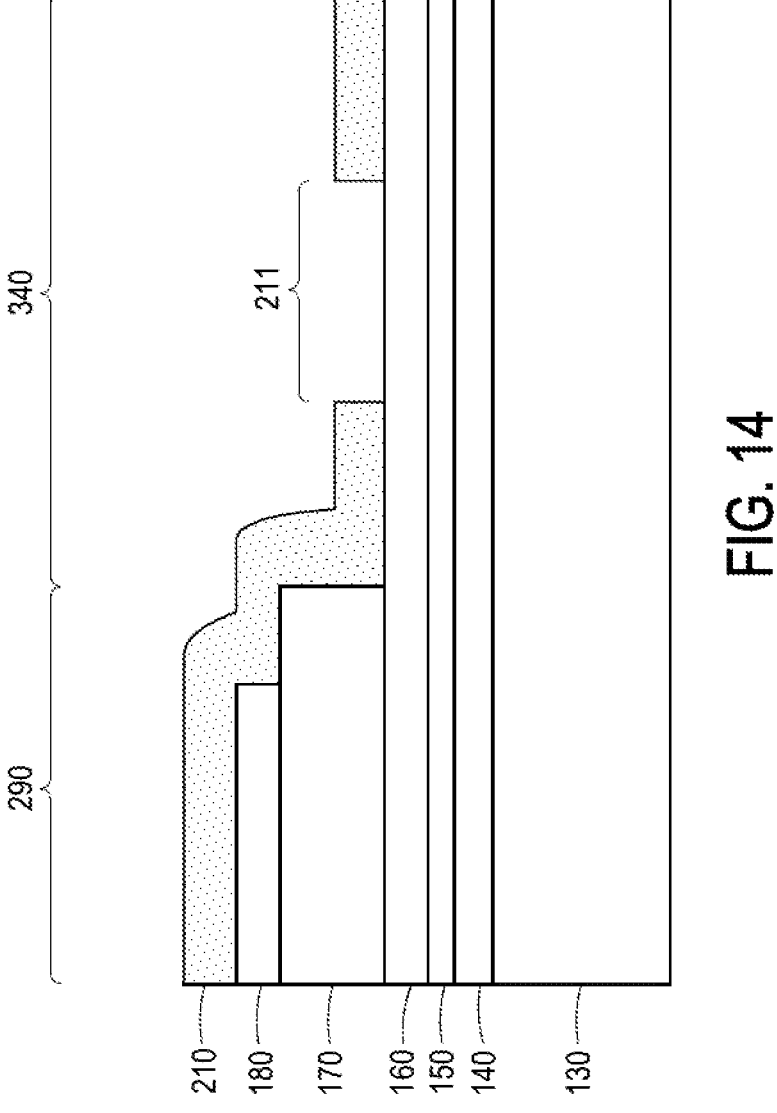
FIG. 14 is a Y-axis cross-sectional view through line B-B of FIG. 2C showing the second capacitor region after the IMD layer is etched to expose a portion of the bottom electrode layer.

Next, then, in step 470 of FIG. 3C and as illustrated in FIG. 14, the IMD layer 210 is patterned to expose the bottom electrode layer 160 in the second capacitor region 340. Recess 211 in the IMD layer is visible here.

Figure 15:
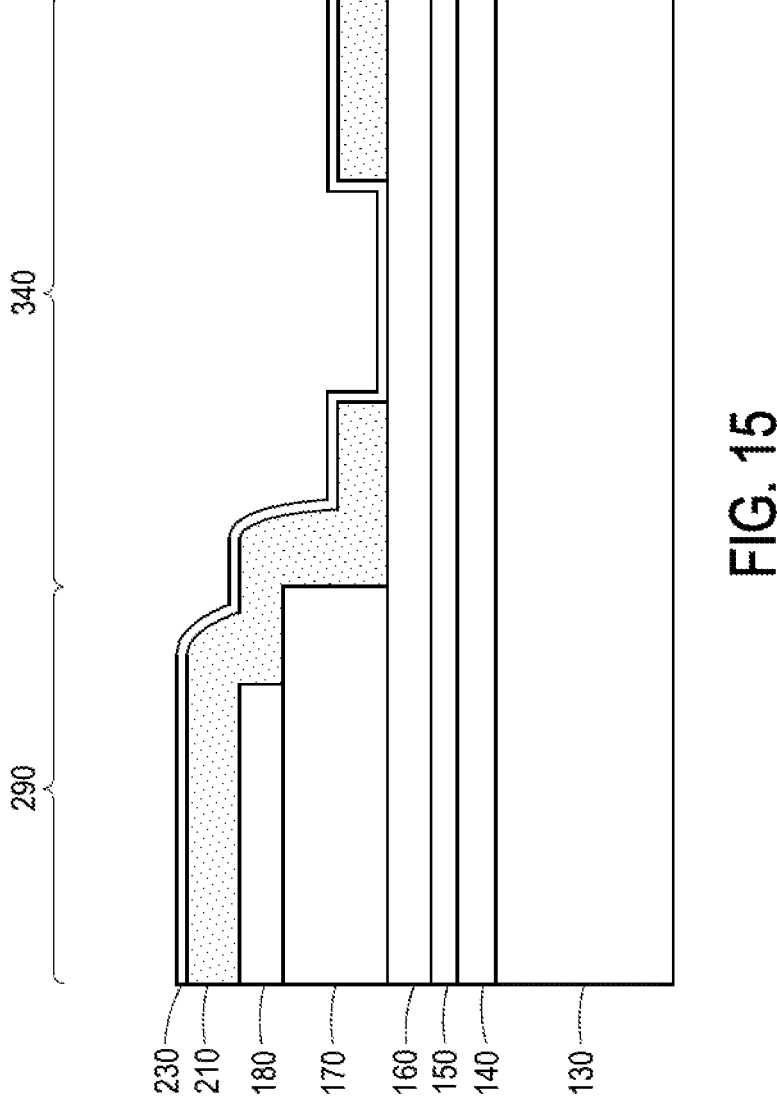
FIG. 15 is a Y-axis cross-sectional view through line B-B of FIG. 2C showing the second capacitor region after a diode layer is applied over the substrate.

Then, in step 475 of FIG. 3C and as illustrated in FIG. 15, a diode layer 230 is applied upon the substrate. As illustrated here, the diode layer is a conformal layer that covers the piezoelectric region 290 and the second capacitor region 340. The diode layer is usually formed as a multi-film stack of a p-type semiconductor and an n-type semiconductor. One non-limiting example of material for the diode layer is a two-film stack of ZnO/ZnO:Al. The diode layer may be formed by any suitable means, such as PVD or ALD. In some embodiments, the diode layer has a thickness of about 200 angstroms to about 500 angstroms, although other ranges and values are within the scope of this disclosure.

Figure 16:
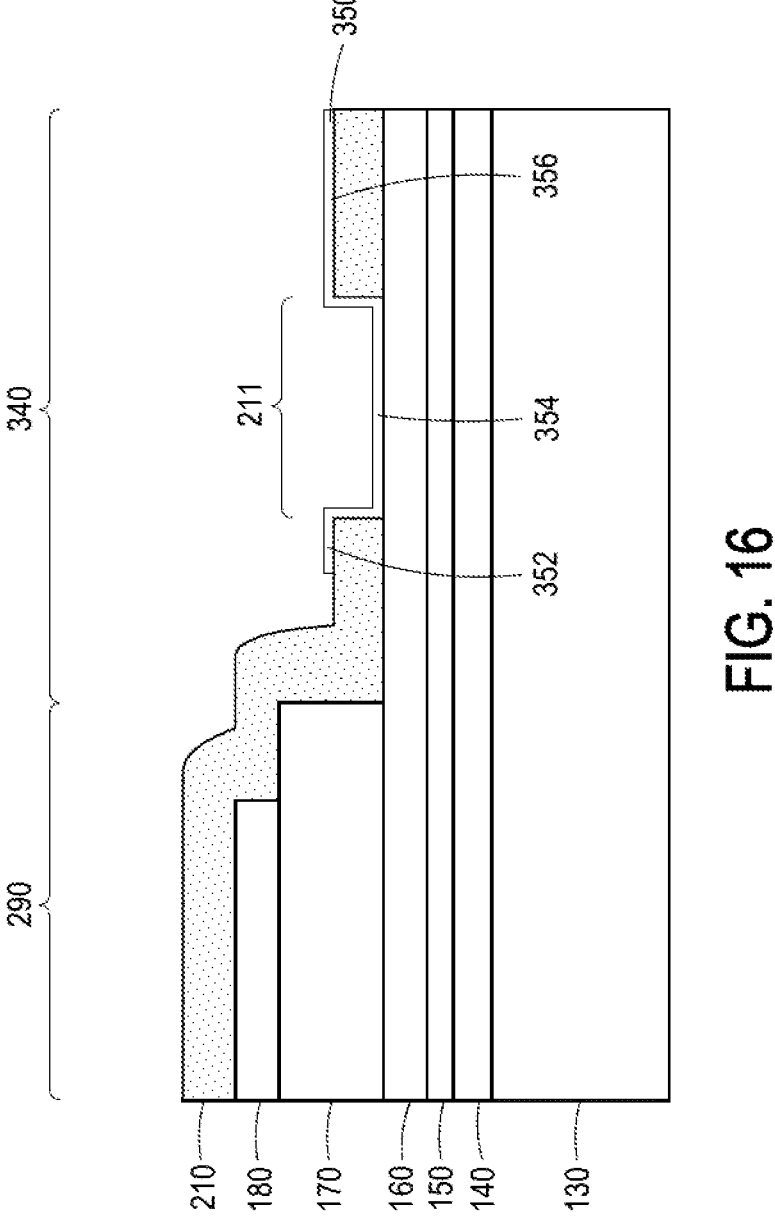
FIG. 16 is a Y-axis cross-sectional view through line B-B of FIG. 2C showing the second capacitor region after the diode layer is patterned to form a diode.

Continuing, in step 480 of FIG. 3C and as illustrated in FIG. 16, the diode layer is patterned to form a diode 350, so that the diode is only present in the second capacitor region 340. As seen here, the diode 350 remains within the recess 211 and upon the portions of the IMD layer 210 adjacent the recess. The diode may be described as including a first end 352, a central region 354, and a second end 356 which are joined together. The first end and the second end may also be referred to as "raised ends", and/or the central region can be referred to as a "lower central region". The first end 352 and the second end 356 can alternatively be described as resting upon the second IMD sublayer 194.

Figure 17:
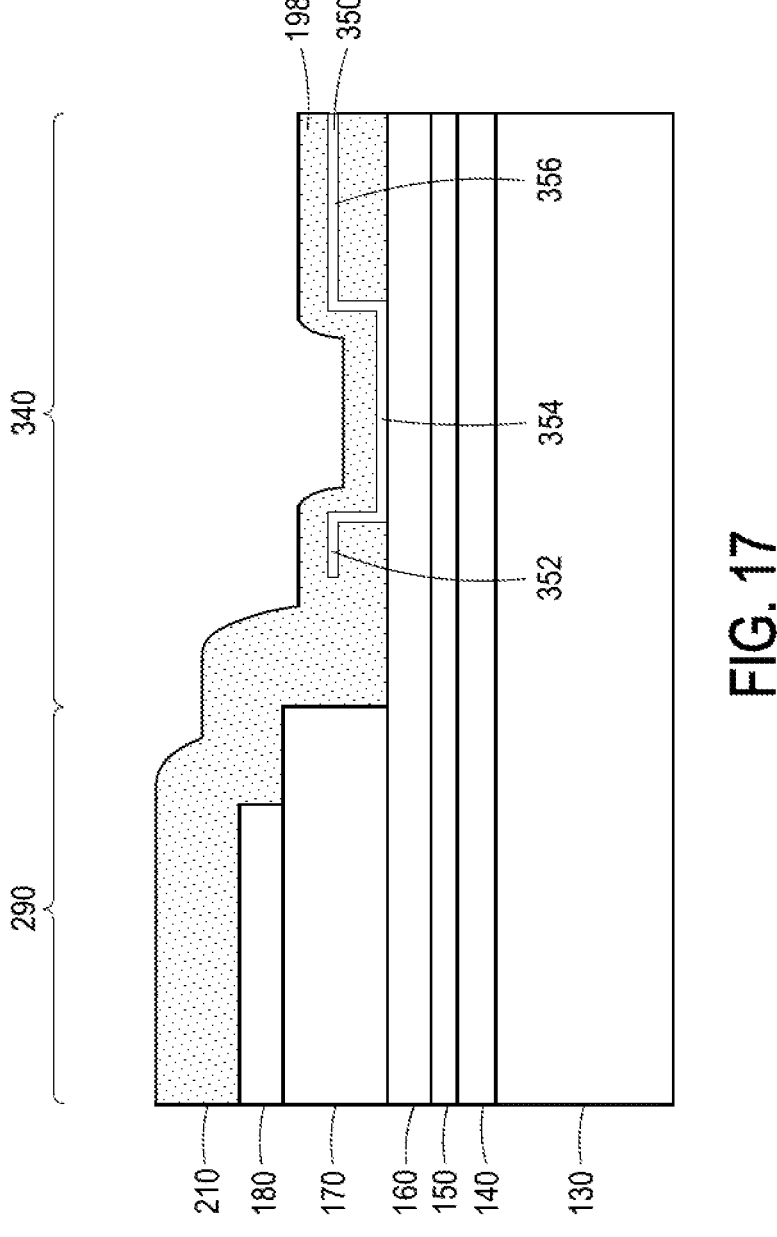
FIG. 17 is a Y-axis cross-sectional view through line B-B of FIG. 2C showing the second capacitor region after a third IMD sublayer is applied over the substrate. The diode is thus covered by the third IMD sublayer.

Then, in step 485 of FIG. 3C and as illustrated in FIG. 17, a third IMD sublayer 198 is applied upon the substrate. As seen in FIG. 13A, the third IMD sublayer 198 covers the diode 350 in the second capacitor region 340. The third IMD sublayer is also a conformal layer and may be formed by any suitable means, including CVD or PVD. In some embodiments, the third IMD sublayer has a thickness of about 1000 angstroms to about 3000 angstroms, although other ranges and values are within the scope of this disclosure. It is noted that the deposition of the third IMD sublayer increases the thickness of the IMD layer 210 in the piezoelectric region.

Figure 18:
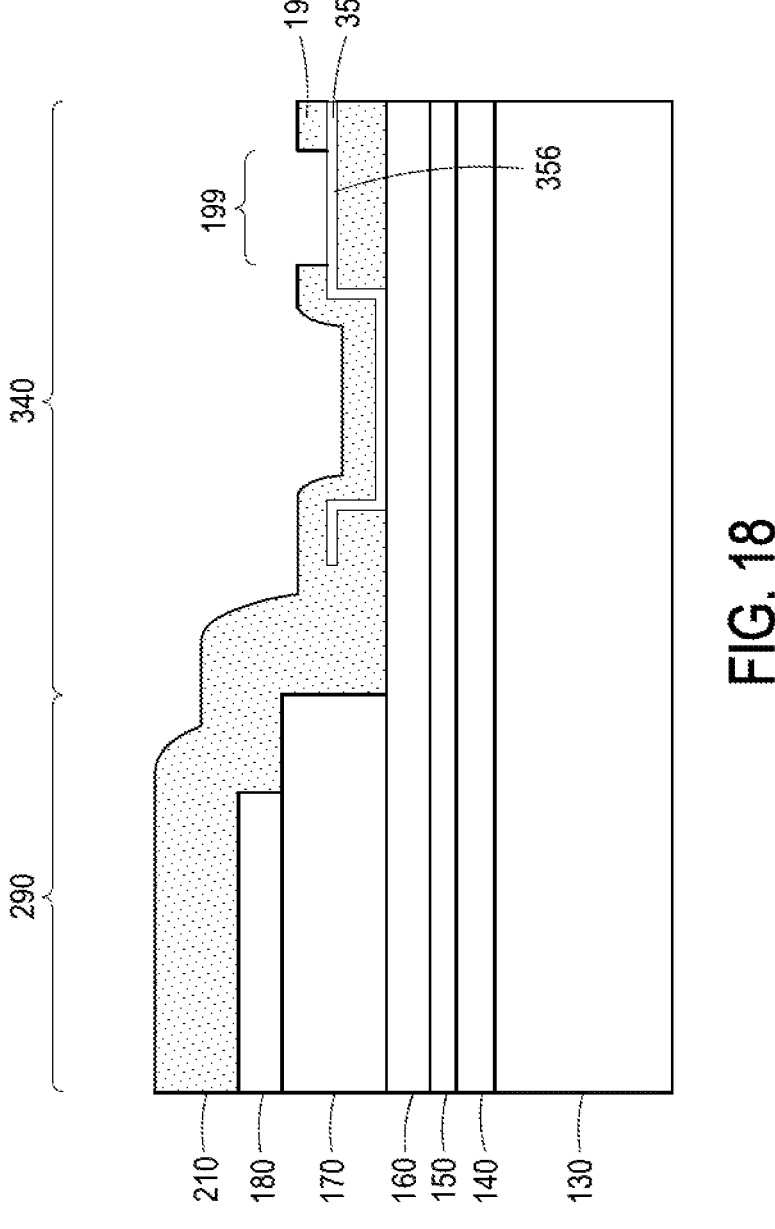
FIG. 18 is a Y-axis cross-sectional view through line B-B of FIG. 2C showing the second capacitor region after the third IMD sublayer is patterned to expose one end of the diode.

Next, in step 490 of FIG. 3C and as illustrated in FIG. 18, the third IMD sublayer 198 is patterned to expose the diode 350 in the second capacitor region 340. Recess 199 in the third IMD sublayer is visible here and exposes the second end 356 of the diode.

Figure 19:
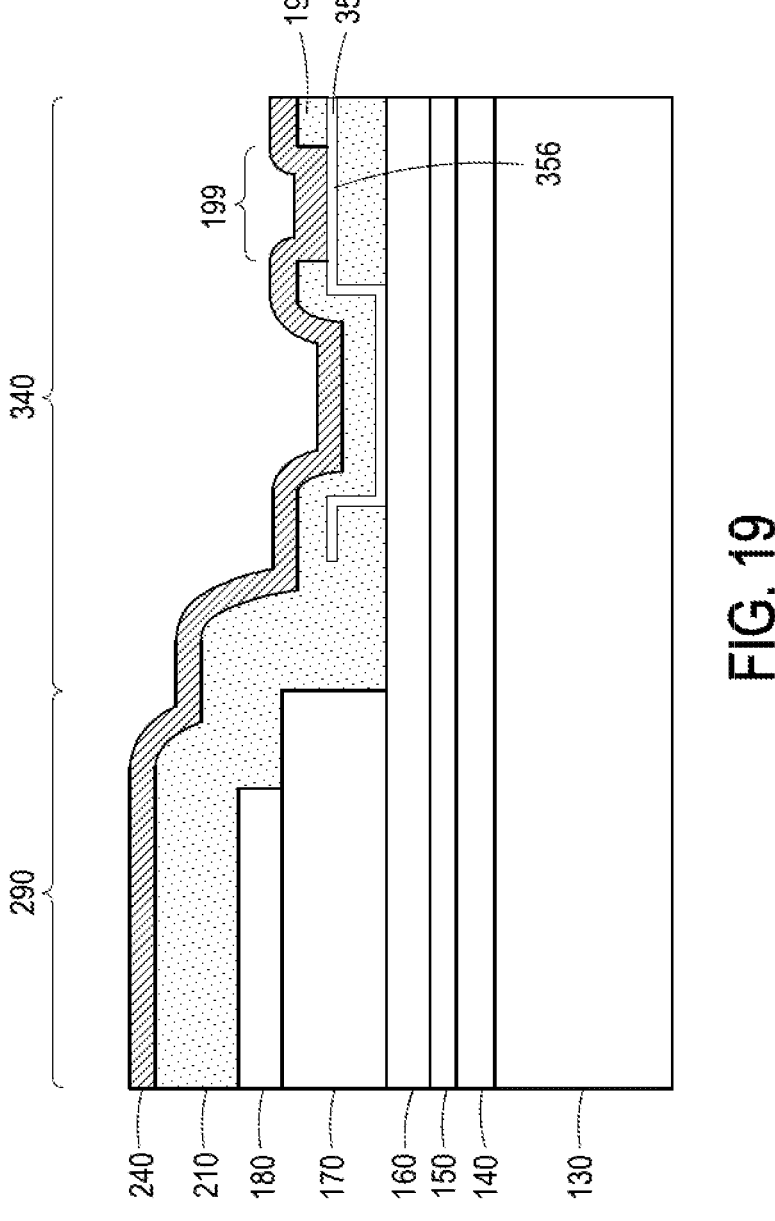
FIG. 19 is a Y-axis cross-sectional view through line B-B of FIG. 2C showing the second capacitor region after a first metal layer is applied over the substrate.

Next, in step 495 of FIG. 3C and as illustrated in FIG. 19, a first metal layer 240 is applied upon the substrate. The first metal layer may be any conductive metal as previously described. The first metal layer is also a conformal layer and may be formed by any suitable means, such as PVD. In some embodiments, the first metal layer has a thickness of about 1000 angstroms to about 3000 angstroms, although other ranges and values are within the scope of this disclosure. As can be seen here, the first metal layer 240 contacts the exposed second end 356 of the diode 350 within the recess.

Figure 20:
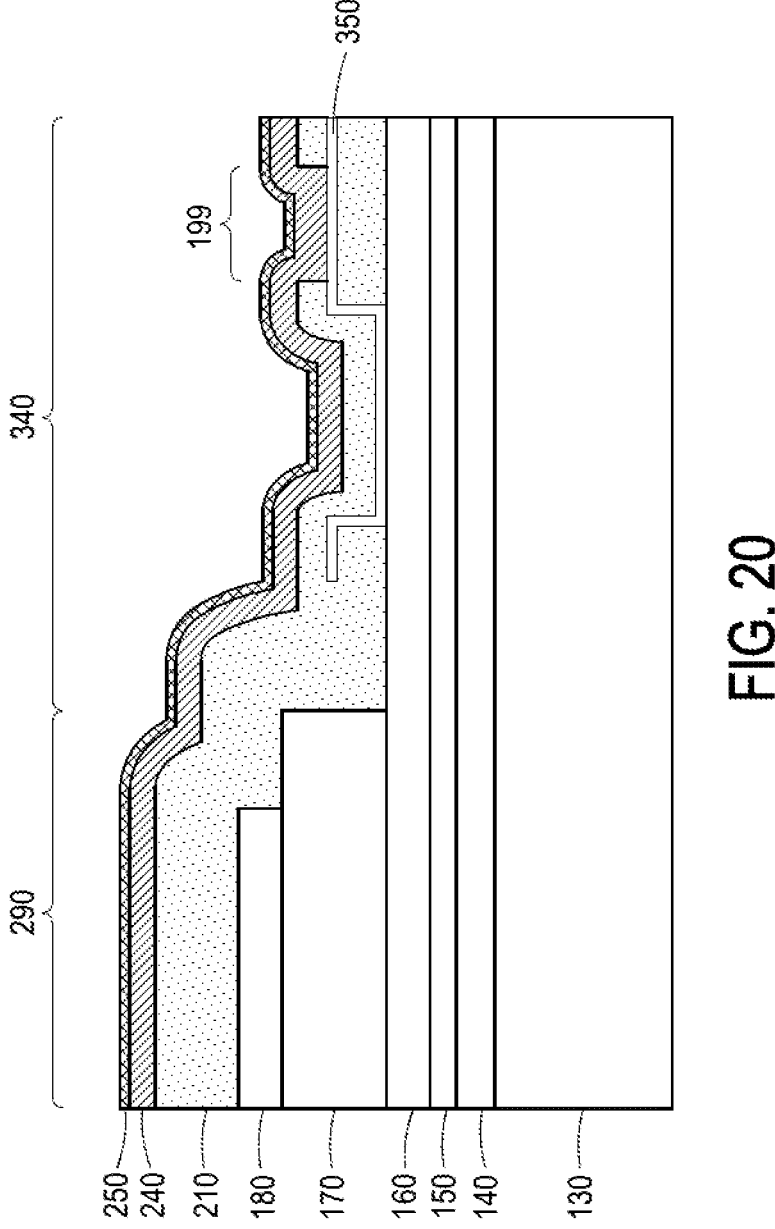
FIG. 20 is a Y-axis cross-sectional view through line B-B of FIG. 2C showing the second capacitor region after a second insulator film is applied over the substrate.

Next, in step 500 of FIG. 3C and as illustrated in FIG. 20, a second insulator film 250 is applied upon the substrate. The second insulator film is a conformal film that covers the piezoelectric region 290 and the second capacitor region 340. The second insulator film is a dielectric material, as previously described with respect to the first insulator film.

The second insulator film may be formed by any suitable means, such as ALD. In some embodiments, the second insulator film has a thickness of about 200 angstroms to about 500 angstroms, although other ranges and values are within the scope of this disclosure. The second insulator film 250 also enters the recess 199 in the third IMD sublayer.

Figure 21:
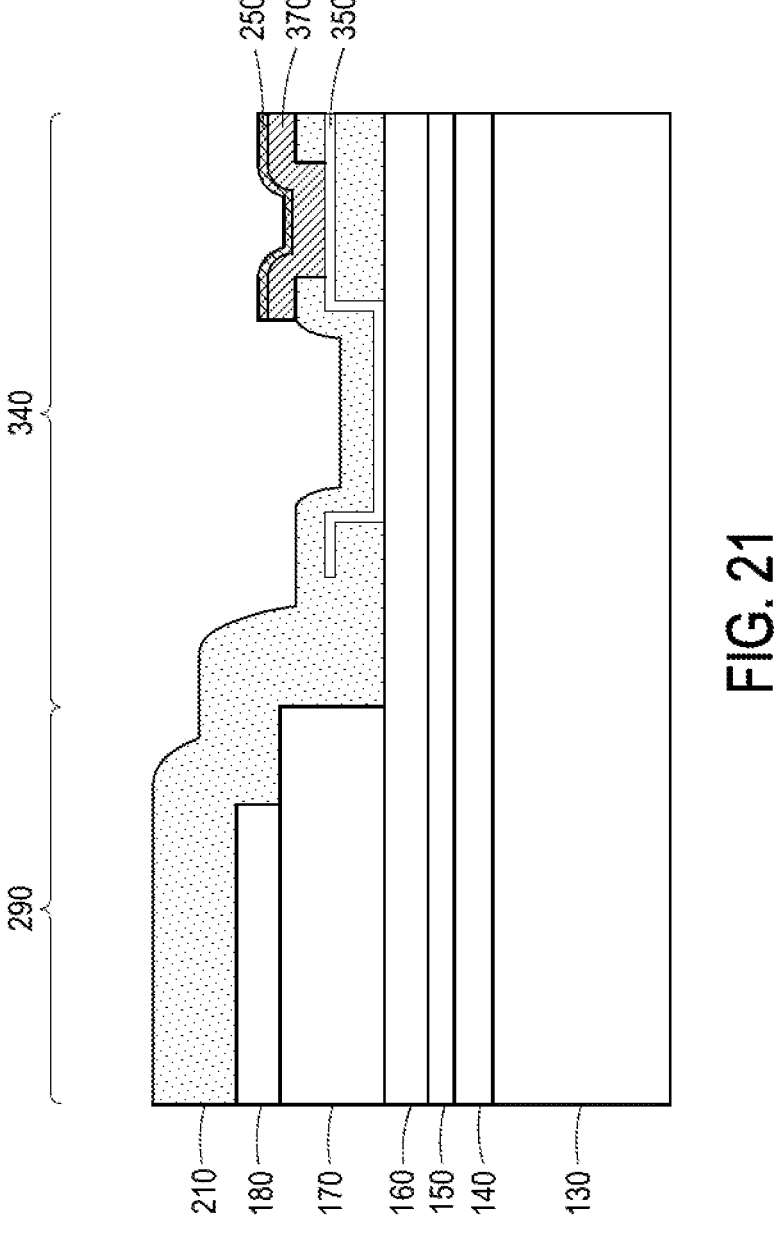
FIG. 21 is a Y-axis cross-sectional view through line B-B of FIG. 2C showing the second capacitor region after the first metal layer and the second insulator film are patterned.

Continuing, in step 505 of FIG. 3C and as illustrated in FIG. 21, the first metal layer 240 and the second insulator film 250 are patterned, so that they are only present in the second capacitor region 340. As seen here, they remain within the recess 199 and upon the portions of the third IMD sublayer 198 adjacent the recess. The patterned portion of the first metal layer in the second capacitor region forms a secondary metal layer 370.

Figure 22:
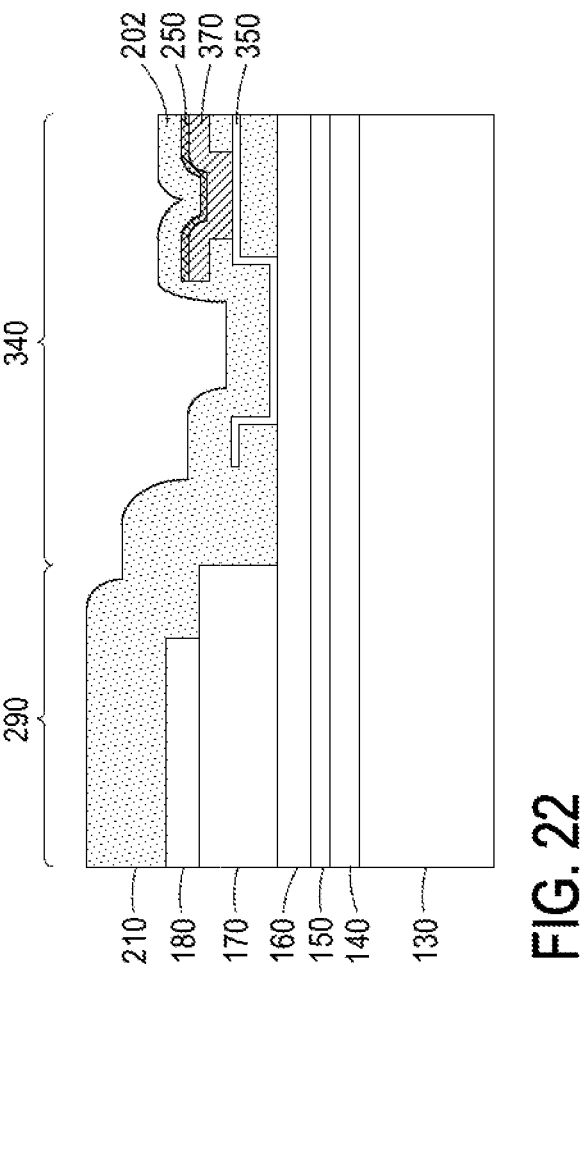
FIG. 22 is a Y-axis cross-sectional view showing the first capacitor region through line A-A of FIG. 2C and the second capacitor region through line B-B of FIG. 2C after a fourth IMD sublayer is applied over the substrate.
Figure 22:
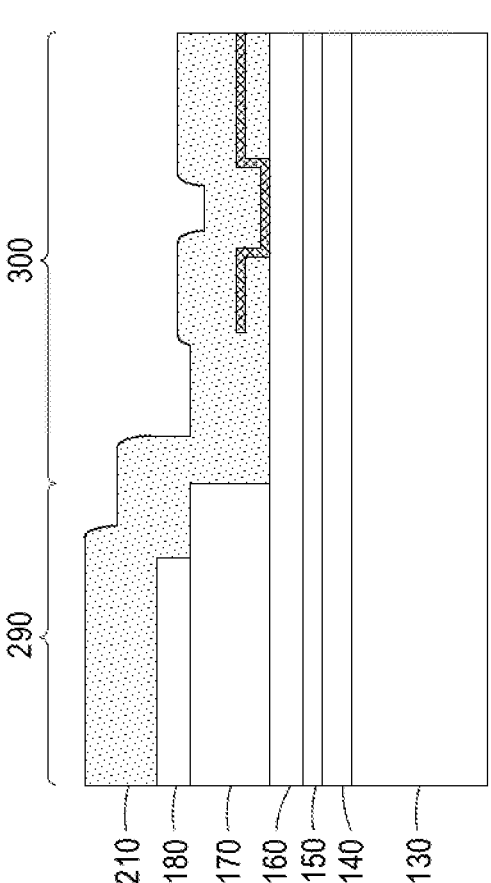

Then, in step 510 of FIG. 3D and as illustrated in FIG. 22, a fourth IMD sublayer 202 is applied upon the substrate. The fourth IMD sublayer is also a conformal layer and may be formed by any suitable means, including CVD or PVD. In some embodiments, the fourth IMD sublayer has a thickness of about 1000 angstroms to about 3000 angstroms, although other ranges and values are within the scope of this disclosure. The resulting structure in the first capacitor region 300 is shown on the left-hand side, and the resulting structure in the second capacitor region 340 is shown on the right-hand side.

As can be seen in the left-hand side illustration of the first capacitor region 300, the deposition of the third IMD sublayer 198 and the fourth IMD sublayer 202 have increased the thickness of the IMD layer 210 in the piezoelectric region and in the first capacitor region 300 (compare to FIG. 13). As can be seen in the right-hand side illustration of the second capacitor region 340, the fourth IMD sublayer 202 covers the second insulator film 250 and the secondary metal layer 370.

As described above, the structures in the first capacitor region 300 are formed first in steps 450-465, and the structures in the second capacitor region 340 are formed second in steps 470-505. These sets of steps could be reversed. However, doing so would increase complexity because a larger number of steps would be needed, which is likely to decrease overall wafer yield.

Figure 23:
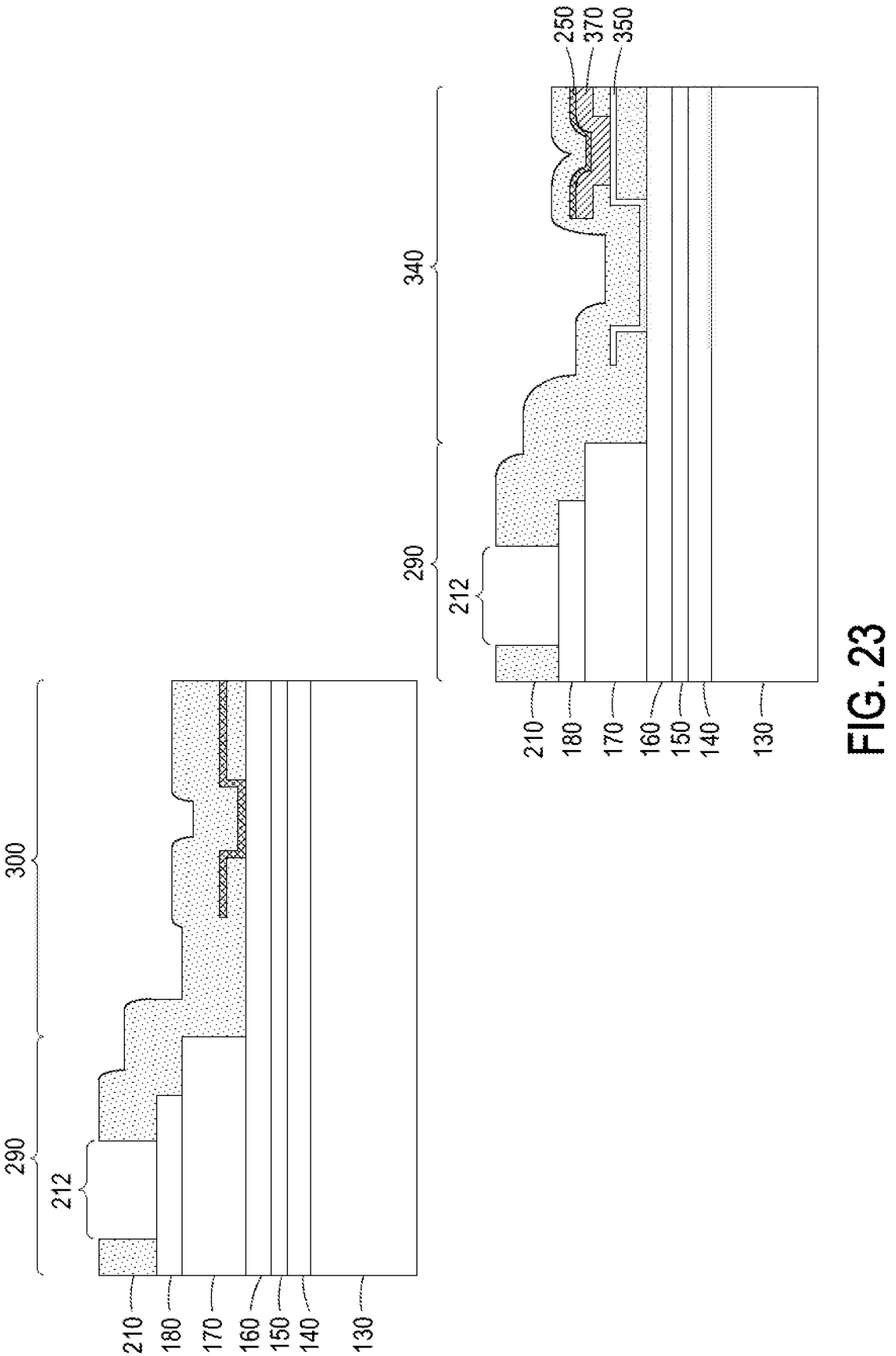
FIG. 23 is a Y-axis cross-sectional view showing the first capacitor region through line A-A of FIG. 2C and the second capacitor region through line B-B of FIG. 2C after the IMD layer is patterned to expose the top electrode layer in the piezoelectric region.

Then, in step 515 of FIG. 3D and as illustrated in FIG. 23, the IMD layer 210 is patterned in the piezoelectric region to expose the top electrode layer 180. Recess 212 in the IMD layer is visible here. It is noted that the recess extends in the X-axis so as to be proximate both the first capacitor region 300 and the second capacitor region 340.

Figure 24:
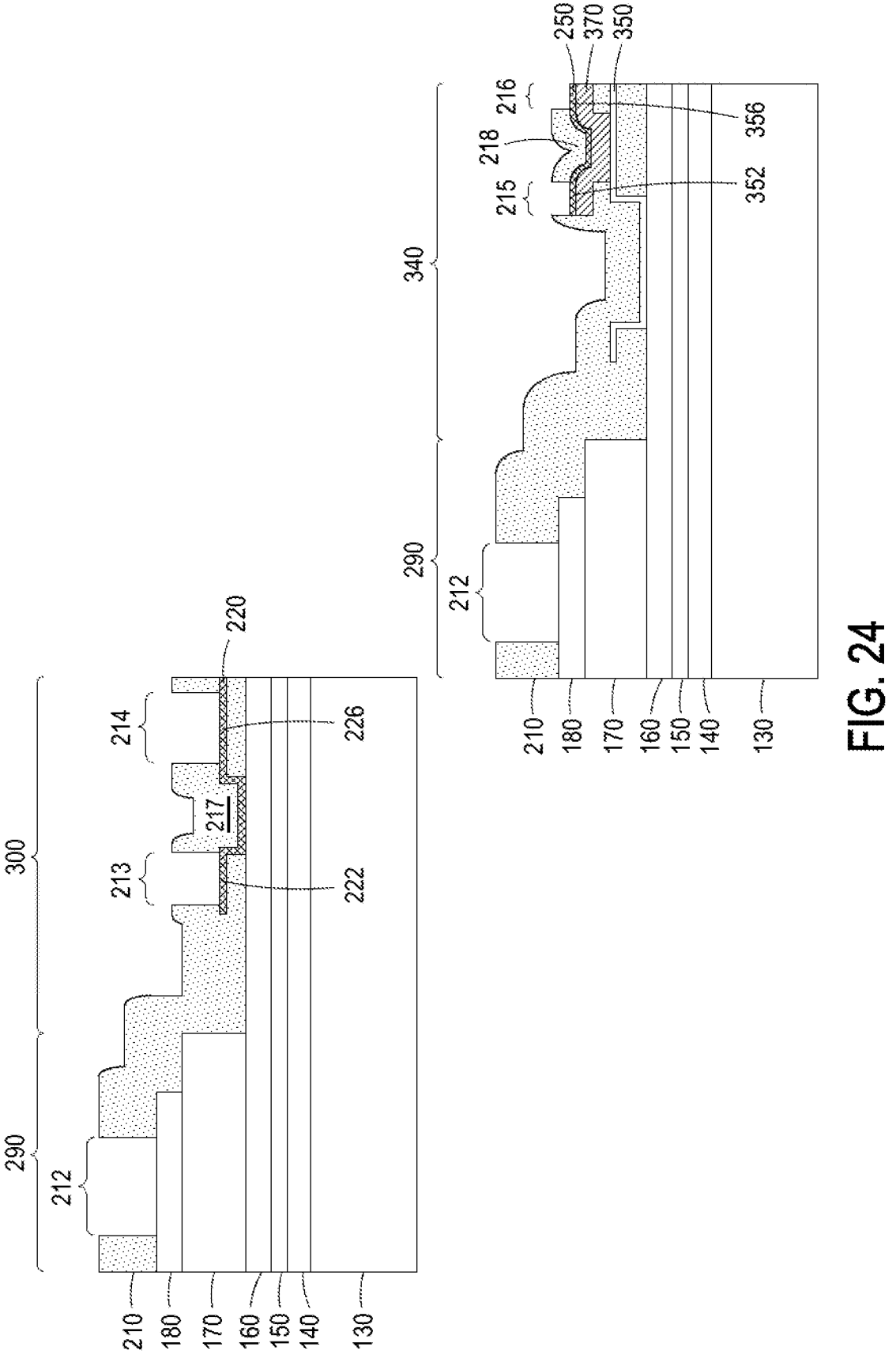
FIG. 24 is a Y-axis cross-sectional view showing the first capacitor region through line A-A of FIG. 2C and the second capacitor region through line B-B of FIG. 2C after the IMD layer is patterned to expose the ends of the first insulator film and the second insulator film.

Next, in step 520 of FIG. 3D and as shown in FIG. 24, the IMD layer 210 is patterned to expose the first end 222 and the second end 226 of the first insulator film 220 in the first capacitor region 300. A portion 217 of the IMD layer thus remains between the first end and the second end of the first insulator film. Similarly, in step 525 of FIG. 3D, the IMD layer is patterned to expose the first end 252 and the second end 256 of the second insulator film 250 in the second capacitor region 340. A portion 218 of the IMD layer thus remains between the first end and the second end of the second insulator film. FIG. 24 shows the resulting structure in the first capacitor region 300 and the second capacitor region 340. Recesses 213, 214 are present in the first capacitor region 300, and recesses 215, 216 are present in the second capacitor region 340. It is noted these two etching steps 520, 525 can be performed in either order. They could also be performed concurrently, depending on the selectivity of the etchant for the IMD layer material compared to the insulator film material.

Figure 25:
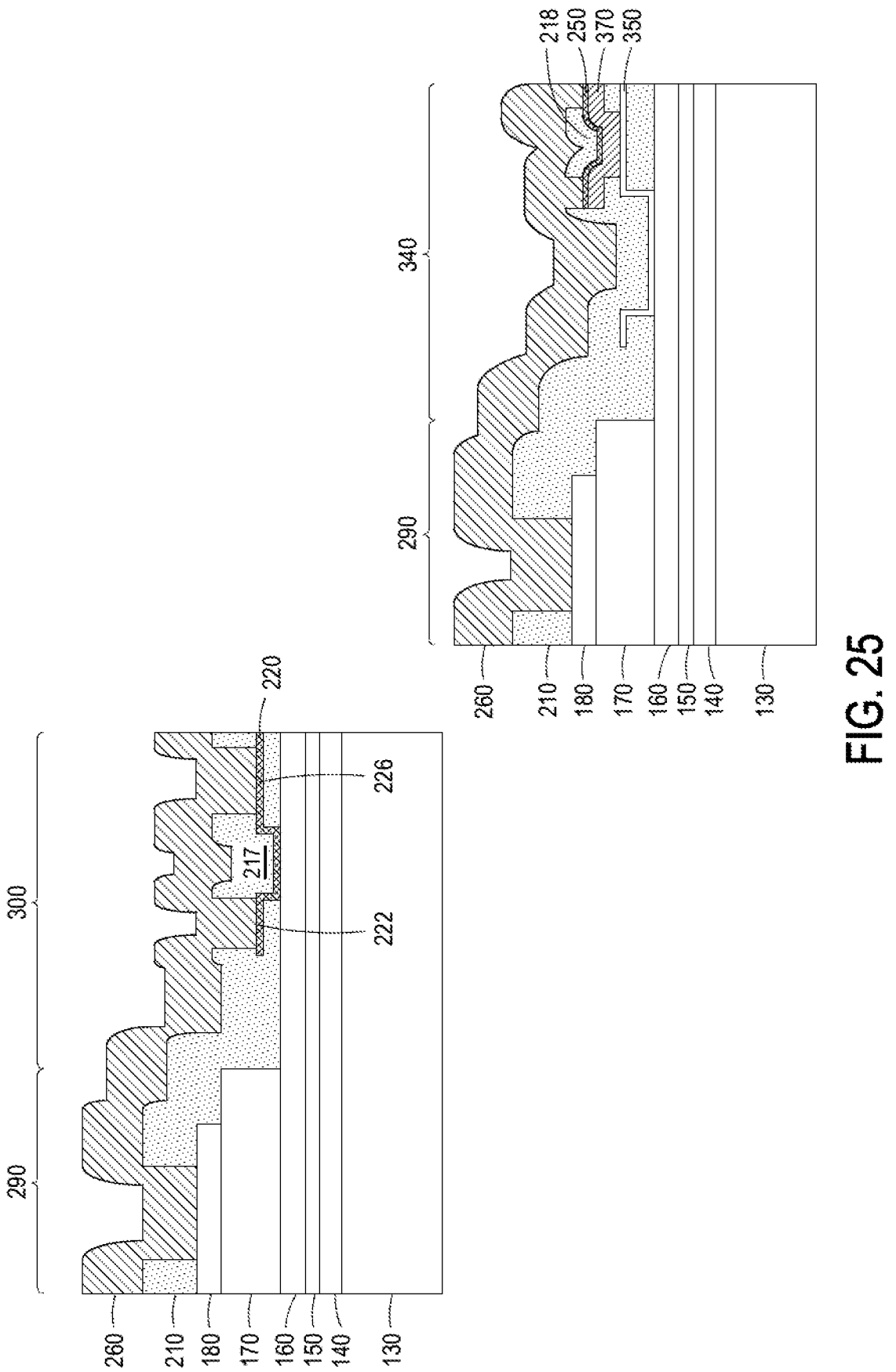
FIG. 25 is a Y-axis cross-sectional view showing the first capacitor region through line A-A of FIG. 2C and the second capacitor region through line B-B of FIG. 2C after a second metal layer is applied upon the substrate.

Next, in step 530 of FIG. 3D and as illustrated in FIG. 25, a second metal layer 260 is applied upon the substrate. The second metal layer may be any conductive metal as previously described, and may be formed as previously described. In some embodiments, the second metal layer has a thickness of about 10,000 angstroms to about 15,000 angstroms, although other ranges and values are within the scope of this disclosure. As can be seen here, the second metal layer fills the recess 212 over the top electrode layer 180 and the recesses 213, 214, 215, 216 in the first capacitor region 300 and the second capacitor region 340 which were illustrated in FIG. 24.

Figure 26:
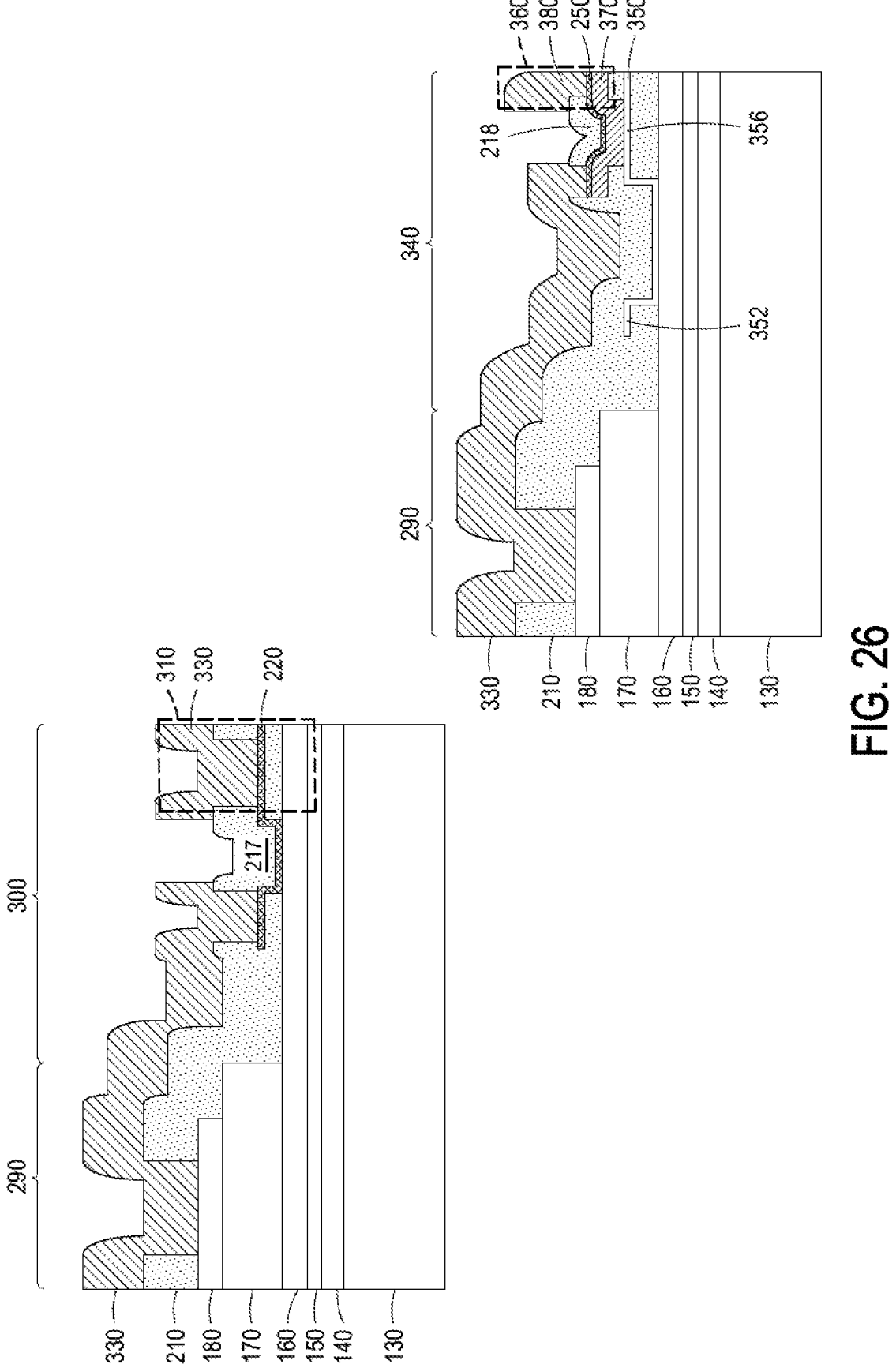
FIG. 26 is a Y-axis cross-sectional view showing the first capacitor region through line A-A of FIG. 2C and the second capacitor region through line B-B of FIG. 2C after the second metal layer is patterned to expose the IMD layer above the central regions of the first insulator film and the second insulator film.

Then, in step 535 of FIG. 3D and as illustrated in FIG. 26, the second metal layer is patterned to form recesses that expose the portion 217 of the IMD layer remaining between the first end 222 and the second end 226 of the first insulator film in the first capacitor region 300, and to expose the portion 218 of the IMD layer remaining between the first end and the second end of the first metal layer in the second capacitor region. As a result, the first capacitor 310 is formed in the first capacitor region 300, and the second capacitor 360 is formed in the second capacitor region 340. Referring to the right-hand side of FIG. 26 showing the first capacitor region 300, the second metal layer forms the primary metal layer 330 referred to in FIG. 2A. Similarly, the second metal layer forms the tertiary metal layer 380 referred to in FIG. 2B. In addition, the metal pads 392, 394, 396, 398 of FIG. 2A and FIG. 2B and their electrical connections are also formed from the second metal layer, which is indicated as step 540.

In FIG. 26, the second capacitor 360 is illustrated as being formed upon the second end 356 of the diode. The second capacitor 360 could alternatively be formed upon the first end 352 of the diode with appropriate modification of the process steps.

Figure 27:
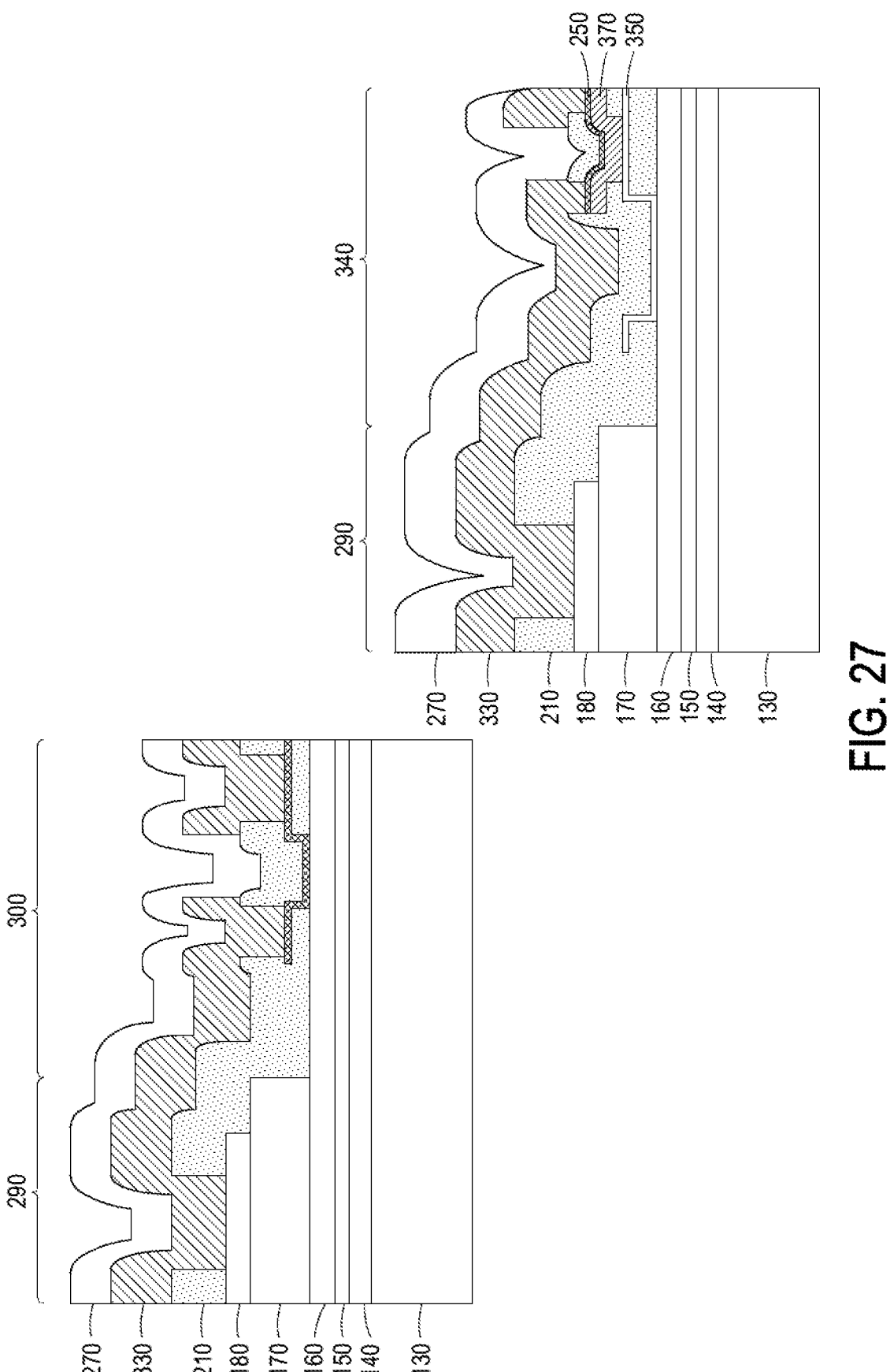
FIG. 27 is a Y-axis cross-sectional view showing the first capacitor region through line A-A of FIG. 2C and the second capacitor region through line B-B of FIG. 2C after a passivation layer is applied upon the substrate.

Continuing, in step 545 of FIG. 3D and as illustrated in FIG. 27, a passivation layer 270 is applied over the substrate 130. The passivation layer is made of a dielectric material, and in one particular embodiment is formed from silicon nitride (SiN). The passivation layer can be made by any suitable method. In some embodiments, the passivation layer has a thickness of about 3000 angstroms to about 7000 angstroms, although other ranges and values are within the scope of this disclosure. If desired, the passivation layer can be further patterned to obtain a desired shape.

Figure 28:
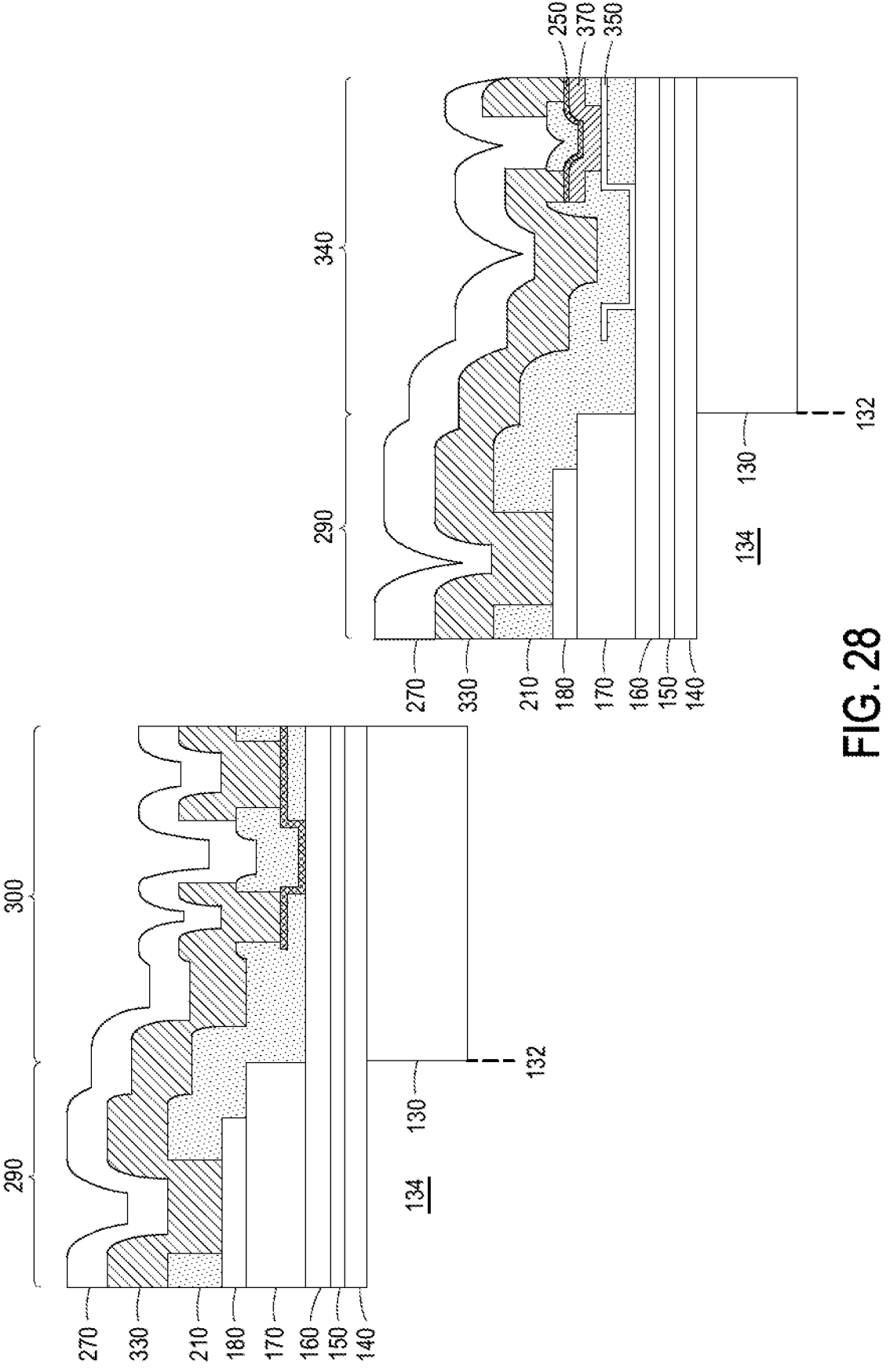
FIG. 28 is a Y-axis cross-sectional view showing the first capacitor region through line A-A of FIG. 2C and the second capacitor region through line B-B of FIG. 2C after etching to form a backside cavity in the substrate.

Then, in step 550 of FIG. 3D and as illustrated in FIG. 28, the substrate below the piezoelectric region 290 or the piezoelectric layer 170 is removed to form a backside cavity 134. Referring back to FIG. 1A, this step is typically performed in conjunction with removing the substrate from the cantilever 120 to obtain the opening in the die. Put another way, the piezoelectric layer and the top electrode layer are present beyond an edge 132 of the substrate 130, or are located over the backside cavity 134.

Desirably, chemical-mechanical planarization (CMP) is not used in forming the dual-capacitor leveling system. The piezoelectric layer 170 is sensitive due to the pressure applied during CMP, which can create issues that are desired to be avoided.

The structures and methods of the present disclosure include several different dielectric layers. Such dielectric layers can generally be made from any suitable dielectric material or combination thereof, although the characteristics of any particular layer may also be further defined. Examples of dielectric materials may include silicon dioxide ($SiO_2$), silicon nitride ($Si_3N_4$), silicon carbide (SiC), hafnium dioxide ($HfO_2$), zirconium dioxide ($ZrO_2$), aluminum oxide ($Al_2O_3$), silicon oxynitride ($SiO_xN_y$), hafnium oxynitride ($HfO_xN_y$) or zirconium oxynitride ($ZrO_xN_y$), or hafnium silicates ($ZrSi_xO_y$) or zirconium silicates ($ZrSi_xO_y$) or silicon carboxynitride ($SiC_xO_yN_z$), or hexagonal boron nitride (hBN). Other dielectric materials may include tantalum oxide ($Ta_2O_5$), nitrides such as silicon nitride, polysilicon, phosphosilicate glass (PSG), fluorosilicate glass (FSG), undoped silicate glass (USG), high-stress undoped silicate glass (HSUSG), and borosilicate glass (BSG).

It is also noted that certain conventional steps are not expressly described in the discussion above. For example, a pattern/structure may be formed in a given layer by applying a photoresist layer, patterning the photoresist layer, developing the photoresist layer, and then etching.

Generally, a photoresist layer may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist composition is then applied to the center of the substrate. The speed of the rotating platen is then increased to spread the photoresist evenly from the center of the substrate to the perimeter of the substrate. The rotating speed of the platen is then fixed, which can control the thickness of the final photoresist layer.

Next, the photoresist composition is baked or cured to remove the solvent and harden the photoresist layer. In some particular embodiments, the baking occurs at a temperature of about 90° C. to about 110° C. The baking can be performed using a hot plate or oven, or similar equipment. As a result, the photoresist layer is formed on the substrate.

The photoresist layer is then patterned via exposure to radiation. The radiation may be any light wavelength which carries a desired mask pattern. In particular embodiments, EUV light having a wavelength of about 13.5 nm is used for patterning, as this permits smaller feature sizes to be obtained. This results in some portions of the photoresist layer being exposed to radiation, and some portions of the photoresist not being exposed to radiation. This exposure causes some portions of the photoresist to become soluble in the developer and other portions of the photoresist to remain insoluble in the developer.

An additional photoresist bake step (post exposure bake, or PEB) may occur after the exposure to radiation. For example, this may help in releasing acid leaving groups (ALGs) or other molecules that are significant in chemical amplification photoresist.

The photoresist layer is then developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Generally, any suitable developer may be used. Sometimes, a post develop bake or "hard bake" may be performed to stabilize the photoresist pattern after development, for optimum performance in subsequent steps.

Continuing, portions of the layer below the patterned photoresist layer are now exposed. Etching transfers the photoresist pattern to the layer below the patterned photoresist layer. After use, the patterned photoresist layer can be removed, for example, using various solvents such as N-methyl-pyrrolidone (NMP) or alkaline media or other strippers at elevated temperatures, or by dry etching using oxygen plasma.

Generally, any etching step described herein may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), nitrogen trifluoride ($NF_3$), or the like, or combinations thereof in various ratios. For example, silicon dioxide can be wet etched using hydrofluoric acid and ammonium fluoride. Alternatively, silicon dioxide can be dry etched using various mixtures of $CHF_3$, $O_2$, $CF_4$, and/or $H_2$.

Figure 29:
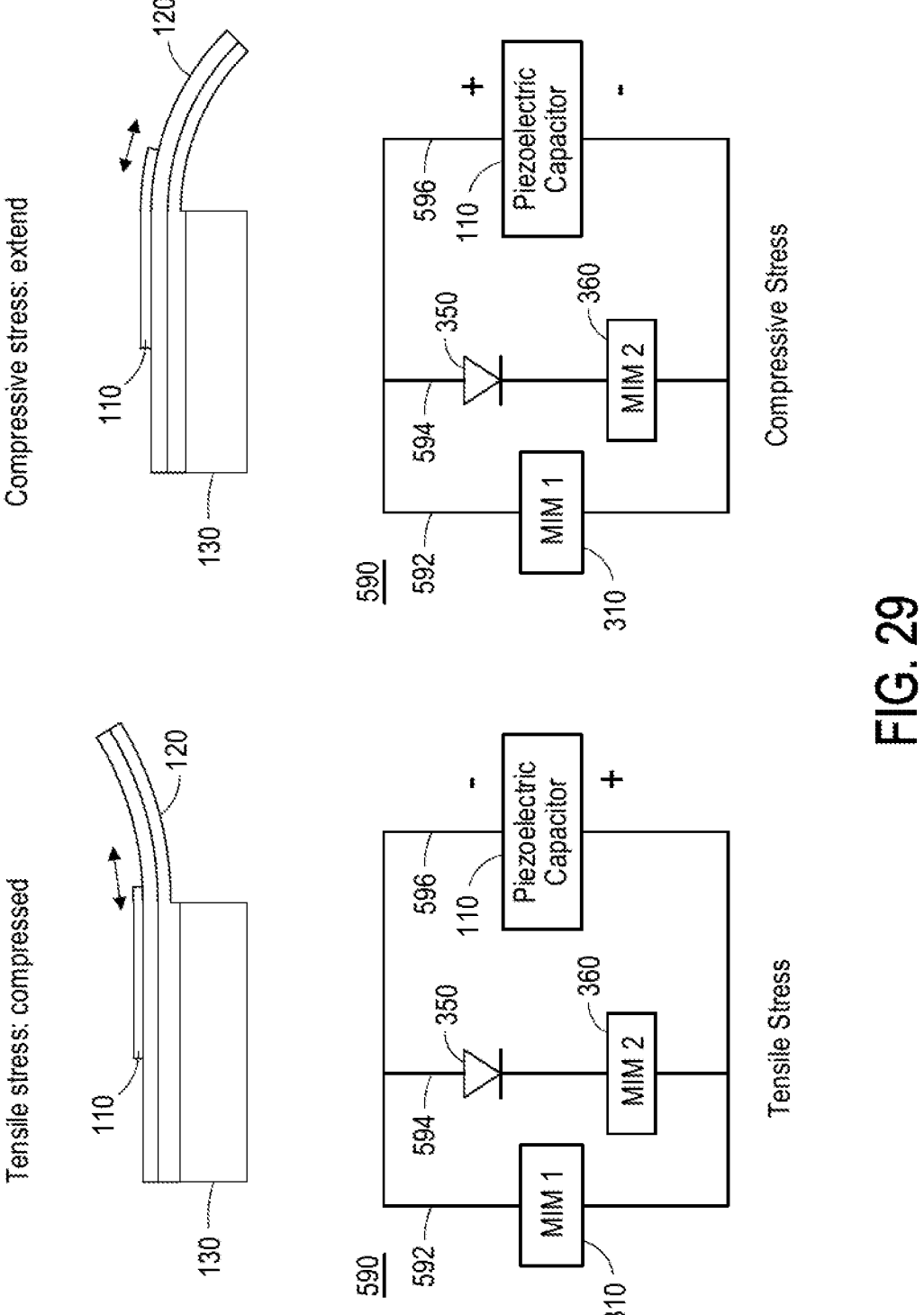
FIG. 29 includes two diagrams illustrating tensile stress and compressive stress in the cantilever, and their resulting electrical circuits.

The resulting dual-capacitor leveling system 280 can be used for calibration of the cantilever 120 shown in FIG. 1A. In this regard, after the substrate is etched to form the backside cavity, the cantilever may shift away from a flat reference plane due to stresses. FIG. 29 provides two illustrations of such stresses. As illustrated here, tensile stress in the piezoelectric capacitor 110 in the Z-axis causes compression in the Y-axis, causing the cantilever 120 to bend upwards relative to the substrate 130. In contrast, compressive stress in the piezoelectric capacitor 110 in the Z-axis causes tensile in the Y-axis, causing the cantilever 120 to bend downwards.

FIG. 29 also provides two circuit diagrams 590 that show how the dual-capacitor leveling system provides information on the cantilever. The first capacitor 310, the second capacitor 360, the diode 350, and the piezoelectric capacitor 110 on the cantilever are electrically connected as illustrated. The circuit diagram is that of a parallel circuit that includes three parallel branches between two nodes. The first branch 592 contains the first capacitor 310. The second branch 594 contains the second capacitor 360 and the diode 350 in series with each other. The third branch 596 contains the piezoelectric capacitor 110 which is located on the cantilever. When the backside cavity is formed to release the cantilever, the charge caused by any deformation or deflection is stored in the first capacitor 310 and the second capacitor 360. The voltage difference on the piezoelectric capacitor 110 will change direction depending on whether tensile stress or compressive stress is present. When the charge through the first branch and the second branch are read, the degree of deformation and the direction of deformation of the cantilever can be determined. A bias voltage can then be applied to the piezoelectric capacitor when a working voltage is applied, so the cantilever is flat in the desired reference plane.

FIG. 30 is a flow chart illustrating a method 600 for leveling a cantilever, in accordance with some embodiments. The steps can be followed with reference to FIG. 29.

In step 605, the cantilever is formed on a substrate. In step 610, a piezoelectric capacitor 110 is formed on the cantilever. In step 615, a three-branch parallel circuit 590 is formed between the piezoelectric capacitor and a dual-capacitor leveling system as previously described. The first capacitor is in a first branch 592, the diode and the second capacitor are in series with each other in a second branch 594, and the piezoelectric capacitor is in a third branch 596. In step 620, the cantilever is released from the substrate. This causes a charge to be stored in the first capacitor and the second capacitor. In step 625, the charge in the first capacitor is read through the first branch. In step 630, the charge in the second capacitor is read through the second branch. In step 635, the readings are used to determine a bias voltage to be applied to the piezoelectric capacitor to level the cantilever. This can be done using an algorithm. It is also contemplated that multiple such calibrations can be performed on multiple cantilevers, and the data can then be used to extrapolate the needed bias voltage for all other die/wafers based on their readings. In step 640, the bias voltage is added to an operating voltage which is sent to the piezoelectric capacitor to level the cantilever during operation.

The MEMS devices including the dual-capacitor leveling systems of the present disclosure have several advantages. The position of the cantilevers after backside cavity release can be quickly determined on a wafer during Wafer Acceptance Testing, rather than after the dies have been separated and packaged. A bias voltage can then be determined to be included with operation voltage through an algorithm to ensure leveling during operation. A consistent cantilever position can thus be provided, which prevents issues such as roll-off, inconsistent operating voltages, and/or pressure loss which can affect sensor readings. The consistent membrane position also reduces the dependence on tight film stress requirements during the manufacturing process. MEMS devices including a cantilever/membrane and the dual-capacitor leveling system can be used for leak detection in systems that need to be tightly sealed, such as acoustic speakers, micropumps, or microvalves.

Some embodiments of the present disclosure thus relate to methods for making a dual-capacitor leveling system for a cantilever. A bottom electrode layer, a piezoelectric layer upon the bottom electrode layer, and a top electrode layer upon the piezoelectric layer are formed. A first capacitor is formed that comprises the bottom electrode layer, a first insulator film upon the bottom electrode layer, and a primary metal layer upon the first insulator film that is electrically connected to the top electrode layer. A diode is formed that is electrically connected to the bottom electrode layer. A second capacitor is formed upon the diode. The second capacitor comprises a secondary metal layer electrically connected to the diode, a second insulator film over the secondary metal layer, and a tertiary metal layer upon the second insulator film that is electrically connected the top electrode layer.

Also disclosed in various embodiments are dual-capacitor leveling systems for a cantilever, comprising a piezoelectric region, a first capacitor, a diode, and a second capacitor. The piezoelectric region comprises a bottom electrode layer, a piezoelectric layer upon the bottom electrode layer, and a top electrode layer upon the piezoelectric layer. The first capacitor comprises the bottom electrode layer, a first insulator film upon the bottom electrode layer, and a primary metal layer upon the first insulator film that is electrically connected to the top electrode layer. The diode is electrically connected to the bottom electrode layer. The second capacitor is located upon the diode. The second capacitor comprises a secondary metal layer electrically connected to the diode, a second insulator film over the secondary metal layer, and a tertiary metal layer upon the second insulator film that is electrically connected to the top electrode layer.

Other embodiments disclosed herein relate to methods for making a dual-capacitor leveling system. A first dielectric layer is formed upon a substrate. An adhesion layer is formed upon the first dielectric layer. A bottom electrode layer is formed upon the adhesion layer. A piezoelectric layer is formed upon the bottom electrode layer. A top electrode layer is formed upon the piezoelectric layer. The top electrode layer and the piezoelectric layer are patterned to expose the bottom electrode layer. A first intermetal dielectric (IMD) sublayer is applied upon the substrate. The first IMD sublayer is patterned to expose the bottom electrode layer in a first capacitor region of the substrate. A first insulator film is formed in the first capacitor region, the first insulator film including a first end, a central region, and a second end. A second IMD sublayer is applied upon the substrate to cover the first insulator film in the first capacitor region and form an IMD layer. The IMD layer is patterned to expose the bottom electrode layer in a second capacitor region of the substrate. A diode is formed in the second capacitor region, the diode including a first end, a central region, and a second end. A third IMD sublayer is applied upon the substrate that covers the diode in the second capacitor region and adds to the IMD layer. The third IMD sublayer is patterned to expose the diode. A secondary metal layer is formed over the diode. A second insulator film is formed over the secondary metal layer. A fourth IMD sublayer is applied upon the substrate that covers the second insulator film in the second capacitor region and adds to the IMD layer. The IMD layer is patterned to expose the top electrode layer. The IMD layer is patterned to expose the first end and the second end of the first insulator film in the first capacitor region, with a portion of the IMD layer remaining above the central region of the first insulator film. The IMD layer is also patterned to expose the first end and the second end of the second insulator film in the second capacitor region, with a portion of the IMD layer remaining above the central region of the second insulator film. A second metal layer is deposited upon the substrate. The second metal layer covers the first end and the second end of the first insulator film and the first end and the second end of the second insulator film. Thus, a first capacitor is formed in the first capacitor region and a second capacitor is formed in the second capacitor region. The substrate is then removed below the piezoelectric layer to form a backside cavity.

Also described in various embodiments herein are methods for leveling a cantilever. The cantilever is formed on a substrate. A piezoelectric capacitor is formed on the cantilever. A dual-capacitor leveling system is formed that includes a first capacitor, and a diode and a second capacitor in series with each other. A three-branch electrical circuit is formed with the first capacitor in a first branch, the diode and the second capacitor in series with each other in a second branch, and the piezoelectric capacitor in a third branch. The cantilever is then released from the substrate to cause a charge to be stored in the first capacitor and the second capacitor. The charge through the first branch is read, and the charge through the second branch is read. A voltage bias to be applied to the piezoelectric capacitor to level the cantilever can be determined by running those readings through an algorithm.

Finally, the present disclosure also relates in various embodiments to MEMS devices that comprise a housing, a cantilever within the housing, a piezoelectric capacitor contacting the cantilever, and a leveling system. The leveling system has a structure as described above. In some embodiments, the housing is solid, and the cantilever is used to detect the presence of one or more leaks in the housing. In other embodiments, the housing also includes an opening, and the cantilever is used either by itself to cover the opening or in conjunction with other cantilevers to cover the opening, as well as to detect fluid flow through the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a dual-capacitor leveling system for a cantilever, comprising:
    forming a bottom electrode layer, a piezoelectric layer upon the bottom electrode layer, and a top electrode layer upon the piezoelectric layer;
    forming a first capacitor that comprises the bottom electrode layer, a first insulator film upon the bottom electrode layer, and a primary metal layer upon the first insulator film that is electrically connected to the top electrode layer;
    forming a diode that is electrically connected to the bottom electrode layer; and
    forming a second capacitor upon the diode, the second capacitor comprising a secondary metal layer electrically connected to the diode, a second insulator film over the secondary metal layer, and a tertiary metal layer upon the second insulator film that is electrically connected to the top electrode layer.

2. The method of claim 1, wherein the primary metal layer of the first capacitor and the secondary metal layer of the second capacitor are concurrently formed.

3. The method of claim 1, wherein the first capacitor is formed by:
    applying a first intermetal dielectric (IMD) sublayer over the bottom electrode layer;
    patterning the first IMD sublayer to expose the bottom electrode layer in a first capacitor region;
    forming the first insulator film in the first capacitor region upon the bottom electrode layer, the first insulator film including a first end, a central region, and a second end;
    applying a second IMD sublayer to cover the first insulator film in the first capacitor region;
    patterning the IMD sublayer to expose the first insulator film in the first capacitor region; and
    applying the primary metal layer over the first insulator film to form the first capacitor.

4. The method of claim 1, wherein the second capacitor is formed by:
    applying a first intermetal dielectric (IMD) sublayer over the bottom electrode layer;
    patterning the first IMD sublayer to expose the bottom electrode layer in a second capacitor region;
    forming a diode in the second capacitor region;
    applying a third IMD sublayer over the second capacitor region;
    patterning the third IMD sublayer to expose the diode;
    forming a first metal layer over the exposed diode;
    forming a second insulator film over the first metal layer; and
    applying the tertiary metal layer over the second insulator film to form the second capacitor.

5. The method of claim 1, further comprising:
    forming a first metal pad electrically connected to the primary metal layer of the first capacitor;

forming a second metal pad electrically connected to the bottom electrode layer of the first capacitor;

forming a third metal pad electrically connected to the tertiary metal layer of the second capacitor; and forming a fourth metal pad electrically connected to the bottom electrode layer below the diode.

6. The method of claim 1, wherein the first capacitor and the second capacitor are formed over a substrate; and wherein the piezoelectric layer and the top electrode layer are present beyond an edge of the substrate.

7. The method of claim 1, further comprising forming the bottom electrode layer over a first dielectric layer.

8. The method of claim 1, further comprising applying a passivation layer over the first capacitor and the second capacitor.

9. The method of claim 1, wherein the diode is formed from an n-type semiconductor and a p-type semiconductor.

10. The method of claim 1, wherein the piezoelectric layer comprises a piezoelectric ceramic.

11. The method of claim 1, wherein planarization is not used in forming the first capacitor or the second capacitor.

12. The method of claim 1, further comprising forming electrical interconnections from the top electrode layer and the bottom electrode layer to a piezoelectric capacitor on the cantilever.

13. A dual-capacitor leveling system for a cantilever, comprising:

a piezoelectric region comprising a bottom electrode layer, a piezoelectric layer upon the bottom electrode layer, and a top electrode layer upon the piezoelectric layer;

a first capacitor comprising the bottom electrode layer, a first insulator film upon the bottom electrode layer, and a primary metal layer upon the first insulator film that is electrically connected to the top electrode layer;

a diode that is electrically connected to the bottom electrode layer; and a second capacitor upon the diode that comprises a secondary metal layer electrically connected to the diode, a second insulator film over the secondary metal layer, and a tertiary metal layer upon the second insulator film that is electrically connected to the top electrode layer.

14. The system of claim 13, further comprising:

a first metal pad electrically connected to the primary metal layer of the first capacitor;

a second metal pad electrically connected to the bottom electrode layer of the first capacitor;

a third metal pad electrically connected to the tertiary metal layer of the second capacitor; and a fourth metal pad electrically connected to the bottom electrode layer below the diode.

15. The system of claim 13, further comprising an intermetal dielectric (IMD) region separating the piezoelectric layer from the first insulator film and the second insulator film.

16. The system of claim 13, wherein the first capacitor and the second capacitor are located over a substrate; and wherein the piezoelectric region is not located over the substrate.

17. The system of claim 13, further comprising a piezoelectric capacitor upon the cantilever which is electrically connected to the piezoelectric region.

18. A method for making a dual-capacitor leveling system, comprising:

forming a first dielectric layer upon a substrate;

forming an adhesion layer upon the first dielectric layer;

forming a bottom electrode layer upon the adhesion layer;

forming a piezoelectric layer upon the bottom electrode layer;

forming a top electrode layer upon the piezoelectric layer;

patterning the top electrode layer and the piezoelectric layer to expose the bottom electrode layer;

applying a first intermetal dielectric (IMD) sublayer upon the substrate;

patterning the first IMD sublayer to expose the bottom electrode layer in a first capacitor region of the substrate;

forming a first insulator film in the first capacitor region, the first insulator film including a first end, a central region, and a second end;

applying a second IMD sublayer upon the substrate to cover the first insulator film in the first capacitor region and form an IMD layer;

patterning the IMD layer to expose the bottom electrode layer in a second capacitor region of the substrate;

forming a diode in the second capacitor region, the diode including a first end, a central region, and a second end;

applying a third IMD sublayer upon the substrate that covers the diode in the second capacitor region and adds to the IMD layer;

patterning the third IMD sublayer to expose the diode;

forming a secondary metal layer over the diode;

forming a second insulator film over the secondary metal layer;

applying a fourth IMD sublayer upon the substrate that covers the second insulator film in the second capacitor region and adds to the IMD layer;

patterning the IMD layer to expose the top electrode layer;

patterning the IMD layer to expose the first end and the second end of the first insulator film in the first capacitor region, with a portion of the IMD layer remaining above the central region of the first insulator film;

patterning the IMD layer to expose the first end and the second end of the second insulator film in the second capacitor region, with a portion of the IMD layer remaining above the central region of the second insulator film;

depositing a second metal layer upon the substrate, the second metal layer covering the first end and the second end of the first insulator film and the first end and the second end of the second insulator film, wherein a first capacitor is formed in the first capacitor region and a second capacitor is formed in the second capacitor region; and removing the substrate below the piezoelectric layer to form a backside cavity.

19. The method of claim 18, further comprising:

forming a first metal pad electrically connected to the second metal layer in the first capacitor region;

forming a second metal pad electrically connected to the bottom electrode layer in the first capacitor region;

forming a third metal pad electrically connected to the second metal layer in the second capacitor region; and forming a fourth metal pad electrically connected to the bottom electrode layer in the second capacitor region.

20. The method of claim 18, further comprising depositing a passivation layer over the substrate.

* * * * *